(12) United States Patent
Hilliges et al.

(10) Patent No.: US 10,025,648 B2
(45) Date of Patent: *Jul. 17, 2018

(54) SYSTEM, METHODS AND APPARATUS USING VIRTUAL APPLIANCES IN A SEMICONDUCTOR TEST ENVIRONMENT

(71) Applicant: ADVANTEST CORPORATION, Tokyo (JP)

(72) Inventors: Klaus-Dieter Hilliges, Shanghai (CN); Jia-Wei Lin, Shanghai (CN); Duncan Gurley, Cupertino, CA (US); Xiaomin Jin, Shanghai (CN); Erik Volkerink, Cupertino, CA (US)

(73) Assignee: Advantest Corporation, Tokyo (JP)

( * ) Notice: Subject to any disclaimer, the term of this patent is extended or adjusted under 35 U.S.C. 154(b) by 221 days.

This patent is subject to a terminal disclaimer.

(21) Appl. No.: 14/840,860

(22) Filed: Aug. 31, 2015

(65) Prior Publication Data

US 2015/0370248 A1 Dec. 24, 2015

Related U.S. Application Data

(63) Continuation of application No. 13/821,559, filed as application No. PCT/US2010/048013 on Sep. 7, 2010, now Pat. No. 9,317,351.

(51) Int. Cl.
*G06F 11/00* (2006.01)
*G06F 11/07* (2006.01)
(Continued)

(52) U.S. Cl.
CPC ...... *G06F 11/0712* (2013.01); *G01R 31/2834* (2013.01); *G01R 31/31907* (2013.01);
(Continued)

(58) Field of Classification Search
CPC ............. G06F 11/0712; G06F 11/2205; G06F 11/2273; G06F 11/261; G06F 11/301;
(Continued)

(56) References Cited

U.S. PATENT DOCUMENTS

| 6,557,128 | B1* | 4/2003 | Turnquist | G01R 31/31908 714/724 |
| 2002/0091979 | A1* | 7/2002 | Cooke | G01R 31/318342 714/733 |
| 2009/0037496 | A1* | 2/2009 | Chong | G06F 11/0709 |
| 2009/0055803 | A1* | 2/2009 | Kondo | G01B 31/318314 717/126 |

(Continued)

*Primary Examiner* — Joseph D Manoskey

(57) ABSTRACT

In one embodiment, a semiconductor test control system includes a computer system having a plurality of hardware resources; a hypervisor installed on the computer system; and a test floor controller installed on the computer system. The hypervisor virtualizes the hardware resources and provides each of at least one virtual appliance with access to a respective virtual set of hardware resources. Each virtual set of hardware resources places its respective virtual appliance in controlling communication with at least a first aspect of a semiconductor test system, thereby enabling the respective virtual appliance to test a respective type of semiconductor device. The test floor controller is in controlling communication with i) at least a second aspect of the semiconductor test system, and ii) each of the at least one virtual appliance.

20 Claims, 13 Drawing Sheets

(51) Int. Cl.
  *G06F 11/22*   (2006.01)
  *G06F 11/30*   (2006.01)
  *G01R 31/28*   (2006.01)
  *G01R 31/319*  (2006.01)
  *G06F 11/26*   (2006.01)
  *G06F 9/455*   (2018.01)
  *G05B 19/418*  (2006.01)

(52) U.S. Cl.
  CPC ... *G05B 19/41875* (2013.01); *G06F 9/45533* (2013.01); *G06F 11/2205* (2013.01); *G06F 11/2273* (2013.01); *G06F 11/261* (2013.01); *G06F 11/301* (2013.01); *G05B 2219/45031* (2013.01)

(58) Field of Classification Search
  CPC ............... G06F 11/263; G06F 9/45533; G05B 19/41875; G05B 2219/45031; G01R 31/2834; G01R 31/31907
  USPC ...................... 714/27, 25, 28, 33, 37, 40, 45
  See application file for complete search history.

(56)         References Cited

U.S. PATENT DOCUMENTS

2010/0095297 A1* 4/2010 Sethi ..................... G06F 8/63
                                                   718/1
2011/0239214 A1* 9/2011 Frields ............... G06F 9/45533
                                                   718/1
2012/0311569 A1* 12/2012 Shah .................. G06F 9/45533
                                                   718/1

* cited by examiner

SYSTEM, METHODS AND APPARATUS USING VIRTUAL APPLIANCES IN A SEMICONDUCTOR TEST ENVIRONMENT

CROSS-REFERENCE TO RELATED APPLICATIONS

This is a Continuation of U.S. patent application Ser. No. 13/821,559 filed Mar. 7, 2013, now U.S. Pat. No. 9,317,351, which is incorporated herein in its entirety.

BACKGROUND

The development cycle of a semiconductor device generally includes a design phase, a fabrication phase, an assembly phase, and a test phase. During the design phase, the functionality of a device is specified, and circuitry for implementing the functionality is laid out and optimized (i.e., a device design is developed). Typically, operation of the circuitry is simulated by a computer, or a physical prototype is constructed, and then the simulated or physical circuitry is tested to determine if it functions as expected. If it does not, the circuitry may be further optimized or redesigned.

During the fabrication phase, the device design is used to construct physical semiconductor devices. Typically, this involves the construction of devices in a production environment. However, the construction of device prototypes in an engineering context is also sometimes considered part of the fabrication phase.

During the assembly phase, semiconductor devices are packaged in various ways. Devices may also be stacked, or otherwise coupled, to form three-dimensional semiconductor devices.

During the test phase, semiconductor devices are tested using one or more test programs, to ensure that the devices function as designed. In some cases, testing may include "go/no go" testing, where devices are evaluated as "good" or "not good". In other cases, and by way of example, testing may be used to separate devices into different performance classes, or to identify failed devices that may be repairable.

Although the development cycle of a semiconductor device typically commences with a design phase and ends with a test phase, the various phases can be performed in parallel or in various orders. For example, the test phase may begin soon after (or in parallel with) the design phase; and simulated, prototype or production devices may be tested during any or all of the design phase, the fabrication phase and the assembly phase. Also, for example, data obtained during the test phase (e.g., functional test data, structural test data, or yield data) may be used in any or all of the design, fabrication or assembly phases to refine or improve a device design, or to identify adjustments in the fabrication or assembly phases that will improve yield. Data obtained during the test phase may also be used to improve, or to adjust (e.g., rewrite or adjust the limits of), the test program itself.

In some cases, a semiconductor device's entire development cycle is provided and managed by an integrated device manufacturer (IDM). However, over the past few decades, it has become more and more common for the phases of a semiconductor device's development cycle to be distributed amongst various parties. For example, a device design and its test program may be developed by a semiconductor design company, such as a fabless semiconductor company. The fabless semiconductor company may then provide the device design and the test program to a wafer foundry or outsourced semiconductor assembly and test (OSAT) facility for the fabrication, assembly and test of semiconductor devices in accord with the design.

A distributed development cycle can provide various advantages, such as specialization, reduction of cost, and sharing of risk. However, a distributed development cycle can also introduce some complications. For example, a semiconductor design company may prefer to use a particular hardware or software platform for designing a device and developing its test program, but a foundry or OSAT facility may prefer to use a different hardware or software platform for executing test programs. Frequently, this requires one or both of the design company and the foundry/OSAT facility to make accommodations for the other. On the design company side, this may require a change in the hardware or software it uses to develop a test program, and sometimes even a change in the hardware or software it uses to design a device. On the foundry or OSAT facility side, differences in the platforms used by it and a design company may require the foundry or OSAT facility to install or configure a new hardware or software platform for executing the design company's test program.

There are other complications that arise with a distributed development cycle. For example, a single semiconductor design company may find it difficult to contract with different foundries and OSAT facilities, because different fabrication, assembly and test vendors may use different hardware or software platforms, and working with these diverse vendors may require the design company to spend significant time reworking its test programs for different hardware or software platforms. Often, this is just not feasible. Similarly, a fabrication, assembly or test vendor may find it difficult to work with some semiconductor design companies, because the design companies provide test programs that are designed for different hardware or software platforms, and the accommodations that the foundry or OSAT facility needs to make to work with different hardware or software platforms are too expensive to absorb (and not feasible to pass on to customers).

Still other complications posed by a distributed development cycle relate to the flow of data between a development cycle's participants. For example, a design company that provides an OSAT facility with electronic information on its device design (including a device test program) will not want this information to be shared with its competitors, which competitors might also be using the services of the OSAT facility. Nor will the design company want the results of its device tests, device yield data, or other proprietary data shared with its competitors. In some cases, the design company might even want to keep this information from the OSAT facility itself. Similarly, the OSAT facility might want to keep certain information about its test floor from its customers.

In some cases, the above noted complications lead to participants in a distributed development cycle being selective about the parties with whom they contract. In other cases, one or both of the parties to a contract will agree to accommodate the platform requirements of the other. However, such accommodations can be costly—both monetarily, and in the form of time delays. One reason for the cost is that semiconductor test software typically uses a complex stack, which stack reaches from embedded software, to low level drivers, to a high level graphical user interface (GUI) and test system controller operating system (OS). Different test programs (e.g., test programs from different design companies, or test programs for different devices) may require, or expect, different software, different operating systems (e.g., RedHat's Linux® or Microsoft's Windows®), and different versions of same. Different test programs may also require or expect deployment on particular types, models or configurations of computer systems (e.g., different workstations). Different test programs may also require, or expect, different environmental settings, code libraries and production integration tools. As a result, a fabrication, assembly or test vendor that is willing to make accommodations may need to install and configure new software, and in some cases may even need to install and configure a new computer system or operating system. This can lead to significant overhead expense, downtime and delay for both a semiconductor design company and its fabrication, assembly and test vendors.

Some of the above-noted complications can also be experienced by an IDM that operates a test floor shared by different product lines.

BRIEF DESCRIPTION OF THE DRAWINGS

Illustrative embodiments of the invention are illustrated in the drawings, in which.

Figure 1:
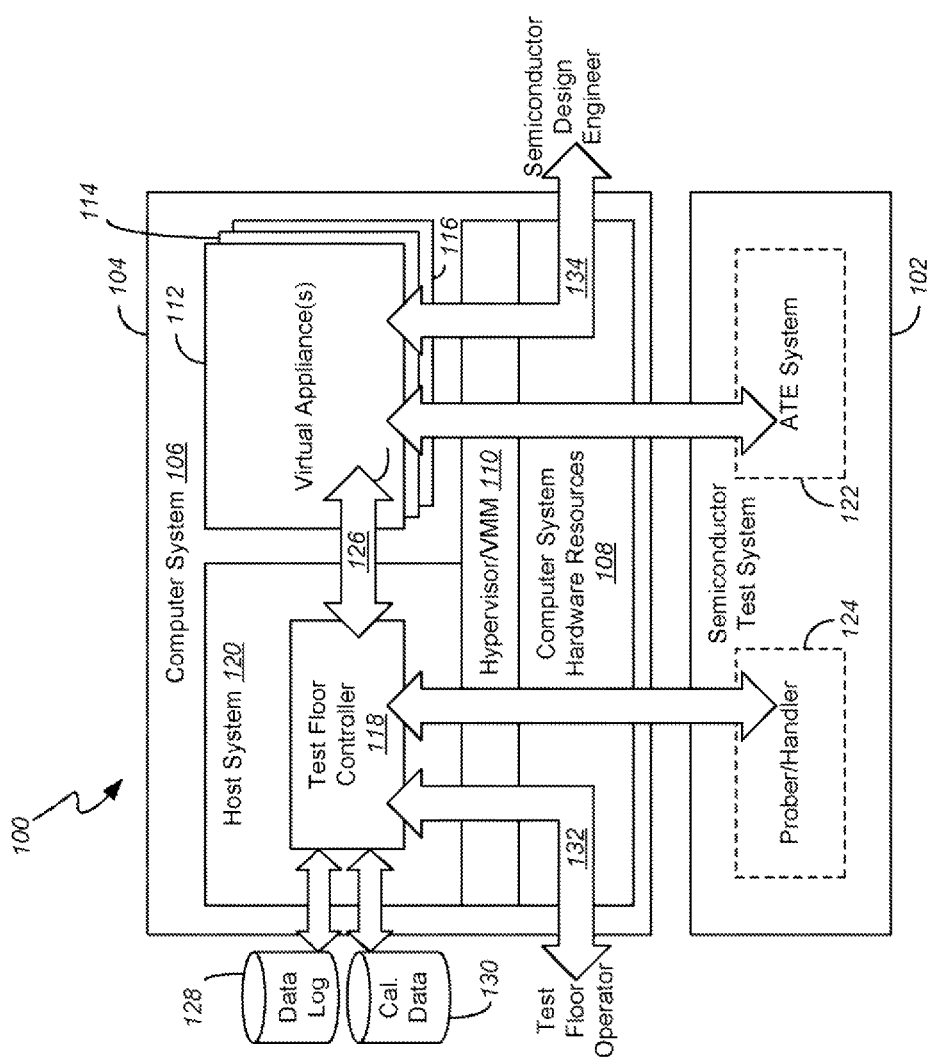
FIG. 1 illustrates an exemplary semiconductor test environment in which a semiconductor test control system interfaces with a semiconductor test system.

It is noted that, in the following description, like reference numbers appearing in different drawing figures refer to like elements/features. Often, therefore, like elements/features that appear in different drawing figures will not be described in detail with respect to each of the drawing figures.

DETAILED DESCRIPTION

Disclosed herein are systems and methods for creating, deploying, operating, and receiving data from, one or more virtual appliances used in a semiconductor test environment. Depending on their embodiments, the systems and methods disclosed herein can provide advantages such as the mitigation or elimination of complications associated with testing semiconductor devices having distributed development cycles, or the mitigation or elimination of complications associated with testing different types of semiconductor devices on a common test floor (including complications arising from use of a shared tester).

To begin, FIG. 1 illustrates an exemplary semiconductor test environment 100 that employs some of the novel systems and methods disclosed herein. The semiconductor test environment 100 comprises a semiconductor test system 102 and a semiconductor test control system 104. During use, the semiconductor test control system 104 dictates how part or all of the semiconductor test system 102 is operated to accomplish testing of one or more semiconductor devices. By way of example, the semiconductor devices under test may be provided on one or more wafers (e.g., for wafer test), on a load board (e.g., for final test), as singulated die, as stacked die, or as packaged die.

The semiconductor test control system 104 comprises a computer system 106, which computer system 106 has a plurality of resources. At least some of the resources are hardware resources 108. A hypervisor 110 installed on the computer system 106 virtualizes at least some of the hardware resources 108 and provides each of at least one virtual appliance 112, 114, 116 with access to a respective virtual set of the hardware resources 108. In turn, each virtual set of the hardware resources 108 places a respective one of the virtual appliances 112, 114, 116 in controlling communication with at least a first aspect of the semiconductor test system 102, thereby enabling the respective one of the virtual appliances 112, 114, 116 to test a respective type of semiconductor device. A test floor controller 118 is also installed on the computer system 106, and is in controlling communication with at least a second aspect of the semiconductor test system 102. The test floor controller 118 is also in controlling communication with each of the at least one virtual appliance 112, 114, 116. In some cases, the test floor controller 118 may be a part of a larger host system 120.

The semiconductor test control system 104 is useful, in some respects, in that it enables a single test floor controller 118 to operate multiple virtual appliances 112, 114, 116, which virtual appliances 112, 114, 116 can be used to operate a shared semiconductor test system 102. Also, by providing different virtual sets of the hardware resources 108 to different ones of the virtual appliances 112, 114, 116, the hypervisor 110 can enforce security and scheduling policies between the virtual appliances 112, 114, 116, as well as security policies between the virtual appliances 112, 114, 116 and the test floor controller 118.

Having generally described the semiconductor test environment 100 shown in FIG. 1, various of its components will now be described in greater detail, beginning with the semiconductor test system 102.

The semiconductor test system 102 may take various forms and may comprise, for example, an automated test equipment (ATE) system 122, a prober/handler 124, and an environmental control system (not shown). The semiconductor test system 102 may also comprise systems or elements such as power supplies, waveform generators, signal acquisition or analysis devices, probe cards, load boards or switching matrices. These additional systems or elements may be integrated with or coupled to other systems or elements of the semiconductor test system 102 (such as the ATE system 122), or may be provided as supplements to (or replacements of) other systems or elements of the semiconductor test system 102. In some cases, the semiconductor test system 102 may comprise more than one of some systems or elements.

By way of example, FIG. 1 illustrates a semiconductor test system 102 having an ATE system 122 and a prober/handler 124. The ATE system 122 and prober/handler 124 may be configured for wafer test (in which case a probe card may be installed on the ATE system 122, and the prober/handler 124 may place semiconductor wafers in contact with the probe card) or final test (in which case a load board may be installed on the ATE system 122, and the prober/handler 124 may populate the load board with packaged semiconductor devices).

The semiconductor test control system 104 and, in particular, the computer system 106, interfaces with the semiconductor test system 102 via one or more wired or wireless interfaces. In some cases, the semiconductor test control system 104 may be largely separate from the semiconductor test system 102. In other cases, the semiconductor test control system 104 may be partly or fully integrated with the semiconductor test system 102, as might be the case if a common entity provides both the semiconductor test system 102 and semiconductor test control system 104, or if the semiconductor test system 102 provides a housing or cabinet for the semiconductor test control system 104.

In some embodiments, all or a majority of the components of the computer system 106 may be provided by a single computer workstation. In other embodiments, the computer system 106 may be provided by a networked or pooled group of computing systems, such as a server farm (e.g., a server blade farm). A network or pooled group of computing systems can be used to divide computing responsibilities between two or more processors or subsystems, or provide redundancy in the case of failure. The computer system 106 may also take other forms.

Regardless of the form the computer system 106 takes, the computer system 106 has a plurality of hardware resources 108. The hardware resources 108 may include resources for carrying out tasks, and resources for communicating with other systems and subsystems, including resources for communicating with the semiconductor test system 102. For example, the hardware resources 108 may comprise one or more processors, processor cores, memories or interfaces. The interfaces may include, for example, memory interfaces, communications interfaces, or storage interfaces.

The hypervisor 110 (also known as a virtual machine monitor) virtualizes some or all of the computer system's resources and provides each of one or more virtual appliances 112, 114, 116 with access to a respective virtual set of the computer system's hardware resources 108. In this manner, the virtual appliances 112, 114, 116 are not provided direct access to the hardware resources 108, but are instead provided access to the hardware resources 108 through their respective virtual sets of the hardware resources 108. This enables the hypervisor 110 to provide shared but controlled access to the hardware resources 108, and enables the hypervisor 110 to enforce security and scheduling policies for the virtual appliances 112, 114, 116 (including deadlines). The security policies can be used to prevent the virtual appliances 112, 114, 116 from interfering with, controlling, or otherwise gaining access to 1) the testing operations or data managed by other virtual appliances 112, 114, 116, 2) the test floor controller 118 or host system 120, or 3) the computer system 106 in general. The scheduling policies can be used to place time or usage limits on a virtual appliance's use of its respective virtual set of the hardware resources 108. Scheduling policies may comprise, for example, heuristic, statistical, static or dynamic scheduling policies.

Each of the virtual appliances 112, 114, 116 provides a platform for testing a respective type of semiconductor device using the semiconductor test system 102. The platform may comprise, for example, a device test program, a particular type and version of software for executing the test program, and a particular type and version of operating system for executing the software. As a virtual appliance 112 executes its test program, a respective virtual set of the hardware resources 108 places the virtual appliance 112 in controlling communication with at least one aspect of the semiconductor test system 102, thereby enabling the virtual appliance 112 to test a respective type of semiconductor device.

The aspect(s) of the semiconductor test system 102 which the hypervisor 110 allows the virtual appliance 112 to control may vary. For example, the hypervisor 110 may allow the virtual appliance 112 to read and write a memory (or portion of memory) where the ATE system 122 stores a test program or test vectors. Or, for example, the hypervisor 110 may allow the virtual appliance 112 to control pin electronics of the ATE system 122, which pin electronics enable stimuli (e.g., test vectors) to be applied, or responses to be read, from test pins of the ATE system (and thereby, to/from one or more pads or ports of a number of semiconductor devices under test). Or, for example, the hypervisor 110 may allow the virtual appliance 112 to control electronics of the ATE system 122 used for scheduling, synchronizing, or switching the use of one or more of the ATE system's test pins. A hypervisor 110 may also allow a virtual appliance to monitor one or more aspects of the semiconductor test system 102, with or without granting the virtual appliance privileges to control the aspects being monitored.

By providing a virtual set of resources to a virtual appliance 112, and by maintaining authority to schedule, revoke or otherwise control the virtual appliance's access to and use of the virtual set of resources, the hypervisor 110 can enforce security and scheduling policies with respect to the virtual appliance, and can limit the aspects of a test system 102 that the virtual appliance 112 can monitor or control.

In some embodiments, a virtual appliance 112 may be provided to (or retrieved by) the computer system 106 as a memory image. In this manner, loading of the memory image by the computer system 106 may result in the installation of a device test program, a particular type and version of software for executing the test program, and a particular type and version of operating system for executing the software. The virtual appliance 112 (or memory image of same) may also comprise, for example, libraries or tools that a semiconductor design company or test developer may want to employ during test of a particular type of semiconductor device. For example, the virtual appliance 112 may comprise a correlation engine. The correlation engine may be configured to monitor an execution environment of the test program and, in response to the monitoring, adjust an execution parameter of the execution environment. In some cases, the execution parameter may be a test program execution speed or a test program memory allocation.

Aspects of the semiconductor test system 102 that are not controlled by a virtual appliance 112, 114 or 116 may be controlled by the test floor controller 118. The test floor controller 118 is also installed on the computer system 106 and, like a virtual appliance 112, is placed in controlling communication with at least one aspect of the semiconductor test system 102. For purposes of this description, a "test floor" is defined to comprise one or more components of a semiconductor test system 102 and, in some cases, a collection of multiple semiconductor test systems. In some cases, a test floor may be a collection of physical systems sitting on a common floor. However, a test floor may also comprise a collection of physical systems sitting on different floors. A test floor may also comprise a collection of both physical and non-physical systems, such as a collection of physical and virtual systems.

Typically, the one or more aspects of a test system 102 that are controlled by the test floor controller 118 will differ from the aspect(s) of the test system 102 controlled by the virtual appliances 112, 114, 116, though this need not be the case. For example, the test floor controller 118 may be configured to control the operation of a prober/handler 124, as well as certain aspects of an ATE system 122 (such as calibration and diagnostics). In contrast, a virtual appliance 112 might be configured to control those aspects of the ATE system 122 that relate to execution of a test program for a particular type of semiconductor device.

As further shown in FIG. 1, the test floor controller 118 is also placed in controlling communication with each of the virtual appliances 112, 114, 116. This may be accomplished, for example, via one or more application programming interfaces (APIs) 126. In this manner, the test floor controller 118 may start, stop or schedule the operation of the virtual appliances 112, 114, 116, or determine which of a plurality of ATE systems or other components of the semiconductor test system 102 are to be allocated to (and possibly controlled, monitored, or used by) the virtual appliances 112, 114, 116. In some cases, the one or more APIs 126, or another interface, enables the test floor controller 118 to enhance or instrument one or more of the virtual appliances 112, 114, 116. In some cases, this sort of interface may be defined by the software of the host system and be well-characterized for all operators of a test floor controller to use. Such standardization also helps to ensure that the interface does not result in the unintentional mingling or sharing of data between different virtual appliances 112 114, 116 (or between a virtual appliance 112 and the operator of the test floor controller 118). In other cases, a custom interface for enhancing and instrumenting a virtual appliance 112 may be defined and provided by the designer of the virtual appliance 112.

The test floor controller 118 may also be configured to receive and process requests or alerts from the virtual appliances 112, 114, 116, such as requests to load a new lot of devices for testing; requests to perform a calibration procedure; requests to log data; or alerts that particular conditions or errors exist. To perform these tasks, the test floor controller 118 may interface with, for example, a data log 128 or a calibration data store 130. The test floor controller 118 may also interface with, or control, software or infrastructures such as a Verigy Production Dashboard (VPD; which is an application offered by Verigy, Ltd.).

The virtual appliance(s) 112, 114, 116 and test floor controller 118 installed on the computer system 106 may control their respective aspects of the semiconductor test system 102 in various ways. In some cases, this may be done by means of an application layer or business logic client of the hypervisor 110. For example, in some embodiments, an application layer may provide any or all of: remote control and monitoring functions; yield data and learning functions; security and licensing functions; or tester and data storage interfaces. Of note, the application layers of different semiconductor test control systems are preferably the same, despite hypervisors and virtual appliances being installed in different hardware environments, or despite the virtual appliances being executed within different host systems.

In some embodiments of the semiconductor test environment 100 shown in FIG. 1, the hypervisor 110 may be installed as a hosted hypervisor, in which case it may be installed as a software application that runs on top of the native operating system of the computer system 106. Alternately, the hypervisor 110 may be installed as a native hypervisor, in which case it may be installed as (or may provide) the native operating system of the computer system 106. In either case, virtual appliances 112, 114, 116 may be installed as software applications that run on top of the hypervisor layer.

The test floor controller 118 may also be installed as a software application that runs on top of the hypervisor 110, in which case the hypervisor 110 may also provide the test floor controller 118 with access to a virtual set of the hardware resources 108 of the computer system 106. In this manner, the virtual set of hardware resources 108 provided to the test floor controller 118 can be used to both 1) place the test floor controller 118 in controlling communication with the aspect(s) of the semiconductor test system 102 which it needs to control, and 2) enforce security policies for the test floor controller 118 and virtual appliances 112, 114, 116. Alternately, the hypervisor 110 may grant the test floor controller 118 direct access to the hardware resources 108 of the computer system 106. In still other cases, a test floor controller 118 may be integrated with (or provided as part of) the hypervisor 110. The test floor controller 118 may also be installed directly on a computer system's native OS (e.g., on par with the hypervisor 110). Regardless, the hypervisor 110 and/or test floor controller 118 should be configured to enforce security policies that prevent the test floor controller 118 from accessing proprietary data of the virtual appliances 112, 114, 116.

In addition to placing a virtual appliance 112 or test floor controller in controlling communication with at least one aspect of a semiconductor test system 102, a virtual set of hardware resources 110 may provide a virtual user interface for accessing, monitoring or controlling its respective virtual appliance or test floor controller. In some cases, a virtual user interface may provide a means for receiving or retrieving data from its respective virtual appliance or test floor controller. The data may comprise, for example, raw test data, processed or analyzed test data, or monitored parameters of the semiconductor test system 102 or semiconductor test control system 104. A virtual user interface 132 or 134 may be coupled to a network such as a private network or the Internet, and a user of a virtual appliance 112 or test floor controller 118 associated with the virtual user interface 132, 134 may locally or remotely connect to the virtual user interface 132, 134. Because the hypervisor 110 controls access to the hardware that underlies the virtual user interfaces 132, 134, the hypervisor 110 may enforce security policies for the virtual user interfaces 132, 134, thereby making each of the virtual user interfaces 132, 134 a secure user interface.

Figure 2:
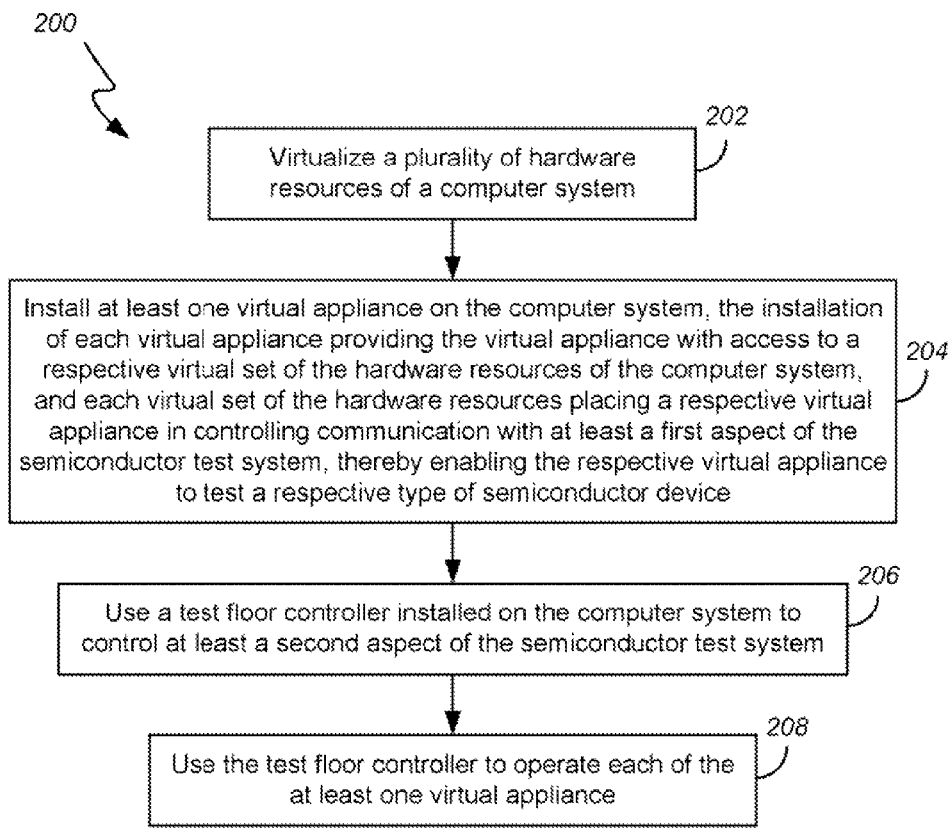
FIG. 2 illustrates an exemplary method of controlling a semiconductor test system, such as the semiconductor test system shown in FIG. 2, to test semiconductor devices.

FIG. 2 illustrates an exemplary method 200 of controlling a semiconductor test system to test semiconductor devices. In some cases, the method 200 may be performed by a semiconductor test control system such as the system 102 shown in FIG. 1. The method 200 comprises virtualizing a plurality of hardware resources of a computer system (at block 202). At block 204, at least one virtual appliance is installed on the computer system. The installation of each virtual appliance provides the virtual appliance with access to a respective virtual set of the hardware resources of the computer system, and each virtual set of the hardware resources places a respective virtual appliance in controlling communication with at least a second aspect of the semiconductor test system, thereby enabling the respective virtual appliance to test a respective type of semiconductor device. At block 206, a test floor controller installed on the computer system is used to control at least a second aspect of the semiconductor test system. At block 208, the test floor controller is used to operate each of the at least one virtual appliance. The test floor controller's operation of a virtual appliance may cause the virtual appliance to execute a test program for testing a respective type of semiconductor device. If the test program is designed to test semiconductor devices using an ATE system, operation of the virtual appliance may cause the virtual appliance to set test vectors on the ATE system.

The steps of the method 200 are shown in an exemplary order. In some cases, the steps may be performed in other orders.

In some embodiments, the systems and methods shown in FIGS. 1 & 2 may employ a single virtual appliance to test a single type of semiconductor device. In other embodiments, the systems and methods may employ a plurality of virtual appliances to test a plurality of different types of semiconductor devices. For the purposes of this disclosure, different "types" of semiconductor devices include, for example: semiconductor devices that perform different functions; semiconductor devices that perform the same function in different ways; or semiconductor devices that perform the same or different functions, but which have been designed or are being tested by different parties. Thus, the functional and structural characteristics of two different types of semiconductor devices may be very different or very similar (and in some cases the same).

Figure 3:
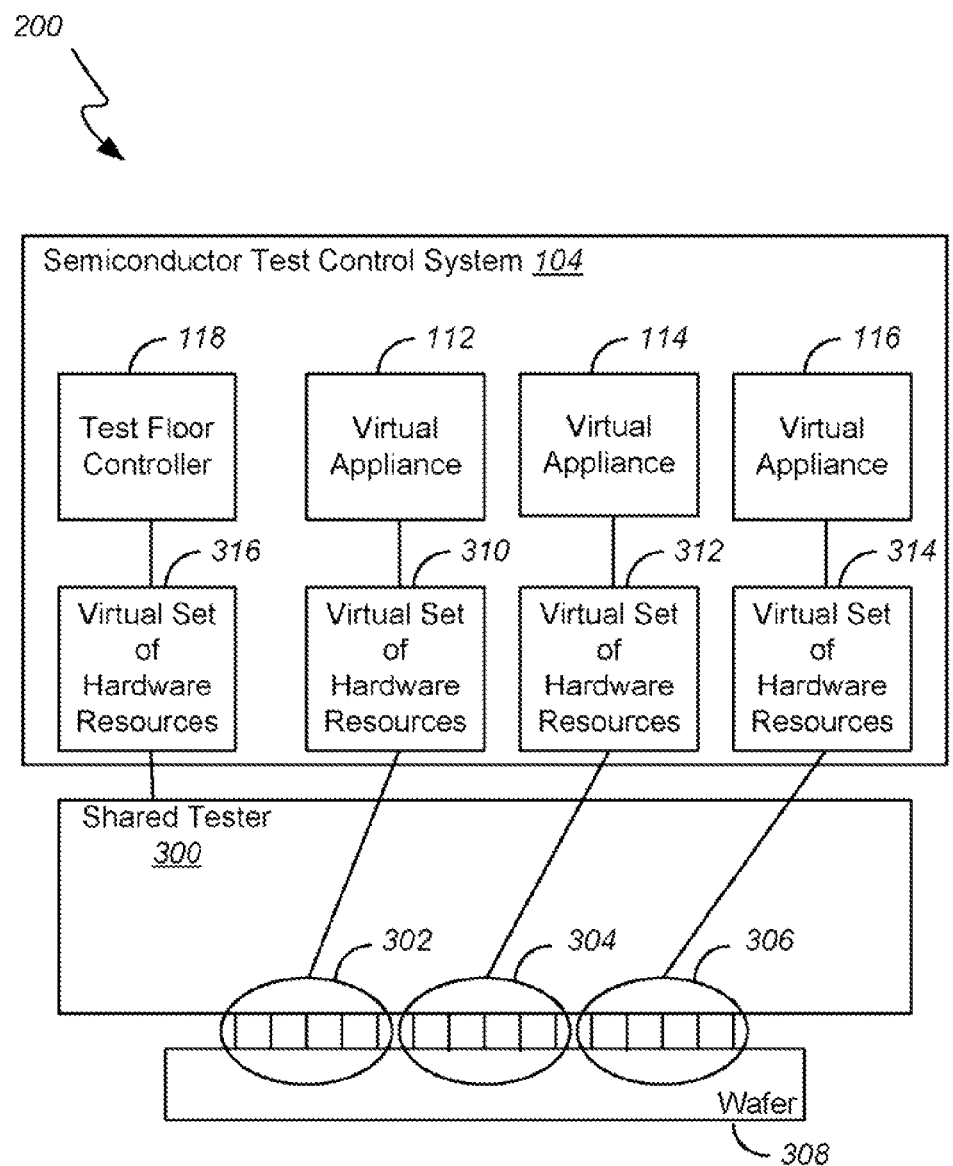
FIG. 3 illustrates an exemplary scenario where a single test floor controller, a plurality of virtual appliances, and a shared tester are used to test a plurality of types of semiconductor devices in parallel.

FIG. 3 illustrates an exemplary scenario where a single test floor controller 118, a plurality of virtual appliances 112, 114, 116, and a shared tester 300 are used to test a plurality of types of semiconductor devices in parallel. By way of example, the shared tester 300 is considered to be an ATE system configured for wafer test. However, the shared tester 300 could take other forms, or could be configured for other types of testing.

An ATE system is typically a multiple pin tester, and a plurality of ATE system test pins are shown in FIG. 3 (grouped in three groups 302, 304, 306). In some cases, ATE systems may have thousands of such test pins. For the purposes of this disclosure, a "test pin" is considered to be any sort of structural element from which a signal is transmitted, or at which a signal is received. The transmitted or received signals may comprise, for example, stimulus, response, power or ground signals.

The shared tester 300 is coupled to a semiconductor test control system 104 such as the system shown in FIG. 1. In use, a wafer 308 or die carrier having semiconductor devices of different types may be coupled to the tester 300. A wafer 308 or die carrier having different types of semiconductor devices thereon can be useful, for example, when 1) a plurality of different parties desire to fabricate and test a limited number of semiconductor devices in engineering mode, or 2) different parties want to fabricate lower numbers of production devices and the overhead for reconfiguring a tester to test different types of devices is significant or undesirable.

In some embodiments, the test floor controller 118 may query the wafer 308 or die carrier, or the semiconductor devices thereon, to determine the configuration of devices to be tested on the wafer 308 or die carrier. The querying may be done via a virtual set of hardware resources 316 provided to the test floor controller, directly via the test floor controller 118, or via the host system 120 (see FIG. 1). In other embodiments, the test floor controller 118 may receive or retrieve configuration data for the wafer 308 or die carrier. In still other embodiments, a user may interact with a user interface of the test floor controller 118 to specify the configuration of devices on the wafer 308 or die carrier.

Regardless of how the test floor controller 118 receives the configuration of devices on the wafer 308 or die carrier, the test floor controller 118 may then map, or simply provide a mapping, of virtual sets of hardware resources 310, 312, 314 of the computer system 104 to test pins 302, 304, 306 of the tester. The test floor controller 118 may perform or provide such a mapping while knowing little or nothing about the nature of the semiconductor devices on the wafer 308 or die carrier. After performing the mapping, the test floor controller 118 may concurrently operate the plurality of virtual appliances 112, 114, 116, thereby causing different types of semiconductor devices to be tested in parallel on the single wafer 308 or die carrier.

In some cases, each of the one or more virtual appliances 112, 114, 116 may be assigned an operational priority or be of a "type" which implies a particular priority. For example, a first of the virtual appliances may be of a "production" type and provide a production test program, while a second of the virtual appliances may be of an "engineering", "debug" or "diagnostic" type and provide a non-production test program. Or, the second of the virtual appliances may be of a "yield learning" type that gathers data from many DUTs for the purpose of yield learning. In such a case, the test floor controller 118 may be configured to give operational priority to the first of the virtual appliances (or to another virtual appliance having a "production" type). Giving "operational priority" may include, for example, giving the virtual set of hardware resources 310 associated with a particular virtual appliance 112 priority access to resources (such as hardware resources 108) of the computer system 106. In some cases, two or more virtual appliances may be of the same type, and a test floor controller 118 may give priority on a first come, first served basis. Or, the test floor controller 118 could give round robin access to resources; or, the test floor controller 118 (or its operator) can assign priority based on other factors.

In addition to testing semiconductor devices on a wafer or die carrier, the semiconductor test control system 104 disclosed in FIG. 1, or the method 200 disclosed in FIG. 2, may be used to test stacked or packaged semiconductor devices, which devices may be positioned on a load board or other carrier. The systems and methods disclosed herein may also be used to test semiconductor devices coupled to different testers. In such cases, the systems and methods still enable sharing of a test floor controller 118 and other resources of a computer system 106. The systems and methods disclosed herein can also be used to test semiconductor devices sequentially. In these cases, virtual appliances that are not being used may remain installed on the computer system 106 (or may be installed on the computer system 106 with less effort than it took to configure a test control system in the past), thereby by reducing the wait time to reconfigure a test system for testing a different type of semiconductor device.

Depending on their implementation, a computer system configured like (or similarly to) the computer system 106 shown in FIG. 1, or the method 200 shown in FIG. 2, can provide various advantages over past systems or methods for controlling a semiconductor test system 102 or test floor. For example, and as already discussed to some degree, the systems and methods enable different parties to securely monitor or control different aspects of a test phase. In particular, a semiconductor design company, such as a fabless semiconductor company, may use a virtual appliance 112 to securely deploy a proprietary device test program on the floor of a foundry or OSAT facility. In some cases, the virtual appliance 112 may enable the semiconductor design company to use a common product engineering environment within the virtual appliance 112. That is, the same engineering environment (operating system, software platform, etc.) can be used to both design a device and create and deploy its test program. For a foundry or OSAT facility, the use of a hypervisor 110 and test floor controller 118 allows the foundry or OSAT to 1) maintain equipment 122, 124 on its test floor, 2) allocate or schedule the use of its equipment 102, 104 to achieve optimum utilization of its equipment 102, 104, and 3) test semiconductor devices designed by different parties, without jeopardizing the security of sensitive information such as device designs, test programs, and yield data. The use of a hypervisor 110 and test floor controller 118 also enables a foundry or OSAT facility to operate different virtual appliances concurrently, thereby causing different test programs to be run concurrently on a common computer system, and in some cases on a shared tester. This may be done while at the same time enforcing security policies that prevent disclosure of one party's device design, test program or test data to another party. Additional advantages of using a computer system 106 such as the one disclosed in FIG. 1, or a method 200 such as the one disclosed in FIG. 2, will be disclosed later in this description.

Attention will now be turned to the division of responsibilities between a test floor controller and a virtual appliance. Responsibilities may be divided in various ways, based on the needs of a particular testing environment. However, it is believed that, in general, and in most cases, responsibilities should be divided to 1) optimize test floor efficiencies and equipment utilization, 2) provide for secure software deployment and data collection on a test floor, and 3) provide for virtual integration of a semiconductor's development cycle. The latter advantage will be discussed more fully later in this description.

Figure 4:
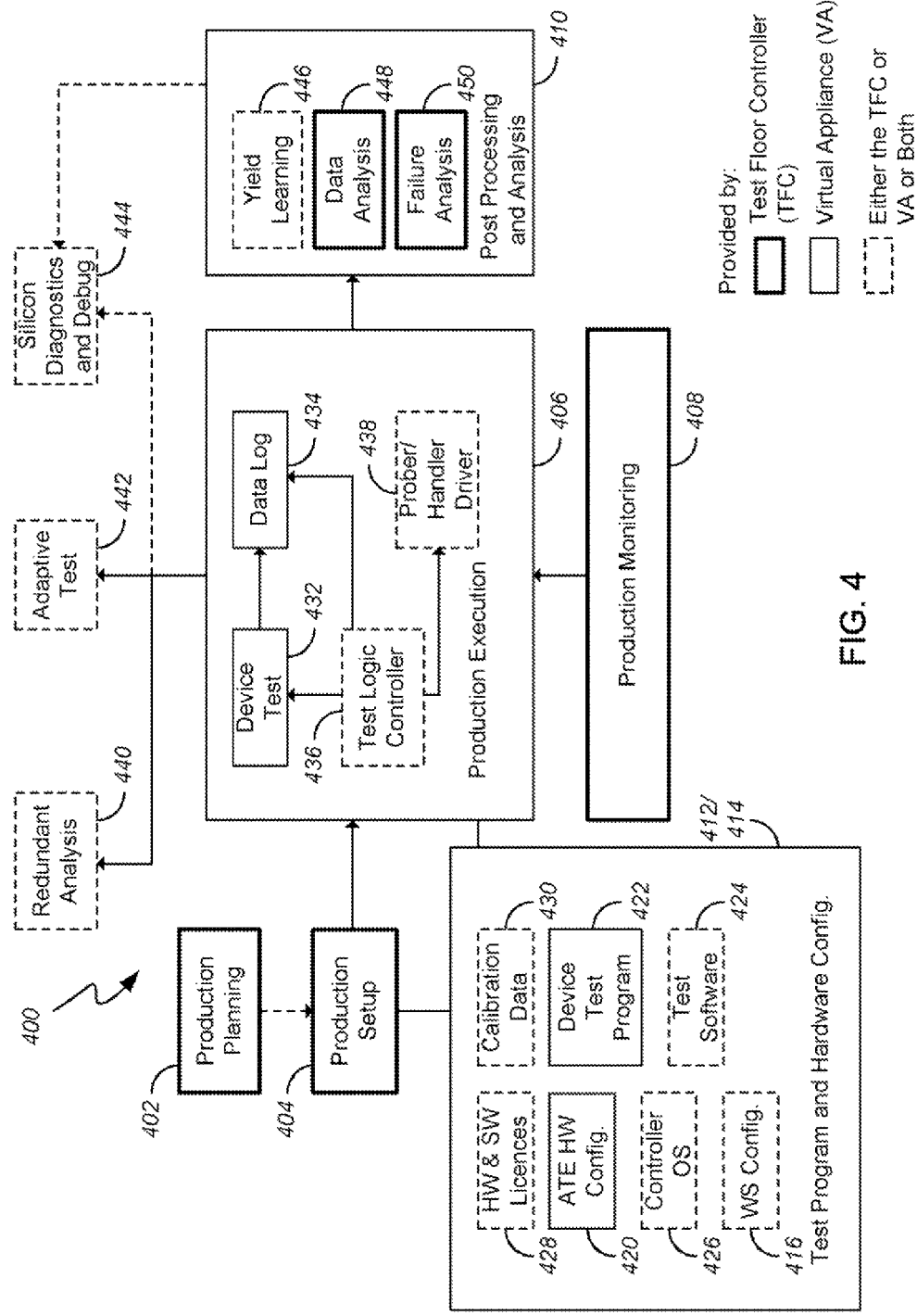
FIG. 4 illustrates an exemplary division of responsibility between a test floor controller and a virtual appliance.

Considering once again an exemplary semiconductor test system 102 comprising a prober/handler 124 and an ATE system 122 (see FIG. 1), FIG. 4 illustrates an exemplary division of responsibilities between a virtual appliance 112 and test floor controller 118 (or host computer system 120, which for purposes of this description is considered to be integrated with the test floor controller 118). FIG. 4 breaks down a production test phase 400 into five general sub-phases; production planning 402; production setup 404; production execution 406; production monitoring 408; and post-processing and analysis 410. Although the sub-phases 402-410 are shown to have a mostly sequential order, one of ordinary skill in the art will recognize that significant overlap, repetition and reconfiguration of the sub-phases 402-410 is possible. In FIG. 4, responsibilities that are advantageously assigned to the test floor controller 118 are outlined in a heavier weight line; responsibilities that are advantageously assigned to a virtual appliance 112 are outlined in a lighter weight line; and responsibilities that can be assigned to either or both of the test floor controller 118 or virtual appliance 112 are outlined with a dashed line.

During the production planning phase 402, a foundry or OSAT facility assesses its workload from various parties, determines what equipment is needed to test what devices, and allocates equipment to achieve an optimum or desired equipment utilization. Factors such as the urgency of certain orders, or the unavailability of certain pieces of equipment, may be taken into account. The configuration of semiconductor devices on a wafer, die carrier or load board, and the usefulness of sharing test equipment, can also be considered. The production planning phase is typically controlled solely by the foundry or OSAT facility, and is therefore supported, as necessary, by the test floor controller 118.

During the production setup phase 404, the allocated equipment is configured to test a particular type or types of semiconductor device(s). This phase is dependent on the equipment and hardware 412 that a foundry has allocated for a particular test setup. As a result, the production setup phase 404 may be carried out by the test floor controller 118. The test floor controller 118 may configure the prober/handler, as well as the probe card or load board of the ATE system.

During the production execution phase 406, a test logic controller may be installed or configured at block 436. This may comprise configuring a computer workstation (WS) 416; installing or configuring an operating system for running a particular type of test software 426 on the workstation; installing or configuring the test software 424; loading a device test program 422; and configuring an ATE system's hardware 420. In some cases, the workstation configuration, operating system or test software may be provided by the test floor controller 118, and the device test program and ATE system hardware configuration may be provided by the virtual appliance. In other cases, the workstation configuration, operating system, test software, test program and ATE system hardware configuration may all be provided by the virtual appliance. In some embodiments, the test software may be Verigy Ltd.'s Smartest software. Either or both of the test floor controller 118 or virtual appliance may also provide hardware (HW) and software (SW) licensing compliance functions 428, calibration functions 430 (e.g., calibration data), and various libraries or tools for testing semiconductor devices.

After the virtual appliance 112 and any necessary hardware are installed and configured, the test floor controller 118 may cause the virtual appliance 112 to execute its test program (e.g., by setting test vectors on an ATE system) at block 432, thereby causing a number of semiconductor devices to be tested. During test, the virtual appliance 112 may receive and log data from the ATE system in a datalog 434. As devices are tested and new devices need to be loaded, the virtual appliance 112 may communicate with the test floor controller 118 to cause the test floor controller 118 to operate the prober/handler (though in some cases, the virtual appliance 112 may itself operate the prober/handler).

In some cases, the production execution phase 406 may comprise, or be followed by, various specialized test phases, such as a redundancy analysis phase 440, an adaptive test phase 442, or a silicon diagnostics and debug phase 444. These specialized test phases 440, 442, 444 may be controlled by the test floor controller 118, by a virtual appliance 112, or by a combination of both.

The production monitoring phase 408 may involve oversight of test floor equipment to ensure that all equipment is operating smoothly and is in working order. Production monitoring is typically a task of the foundry or OSAT facility, and is therefore performed by the test floor controller 118.

During the post-processing and analysis phase 410, data and failure analysis 448, 450 may be coordinated or performed by the test floor controller 118, so that wafers or devices can be moved to their appropriate next processing stations. However, yield learning 446 may be coordinated or performed by either or both of the test floor controller 118 and virtual appliance 112. By giving the test floor controller 118 access to yield learning data, the test floor controller 118 (or a foundry or OSAT facility operator) may take steps to improve yield by making appropriate modifications (e.g., by calibrating) test floor equipment. On the other hand, a semiconductor design company may choose to keep yield data proprietary, and only share data with a foundry or OSAT facility as necessary.

Figure 5:
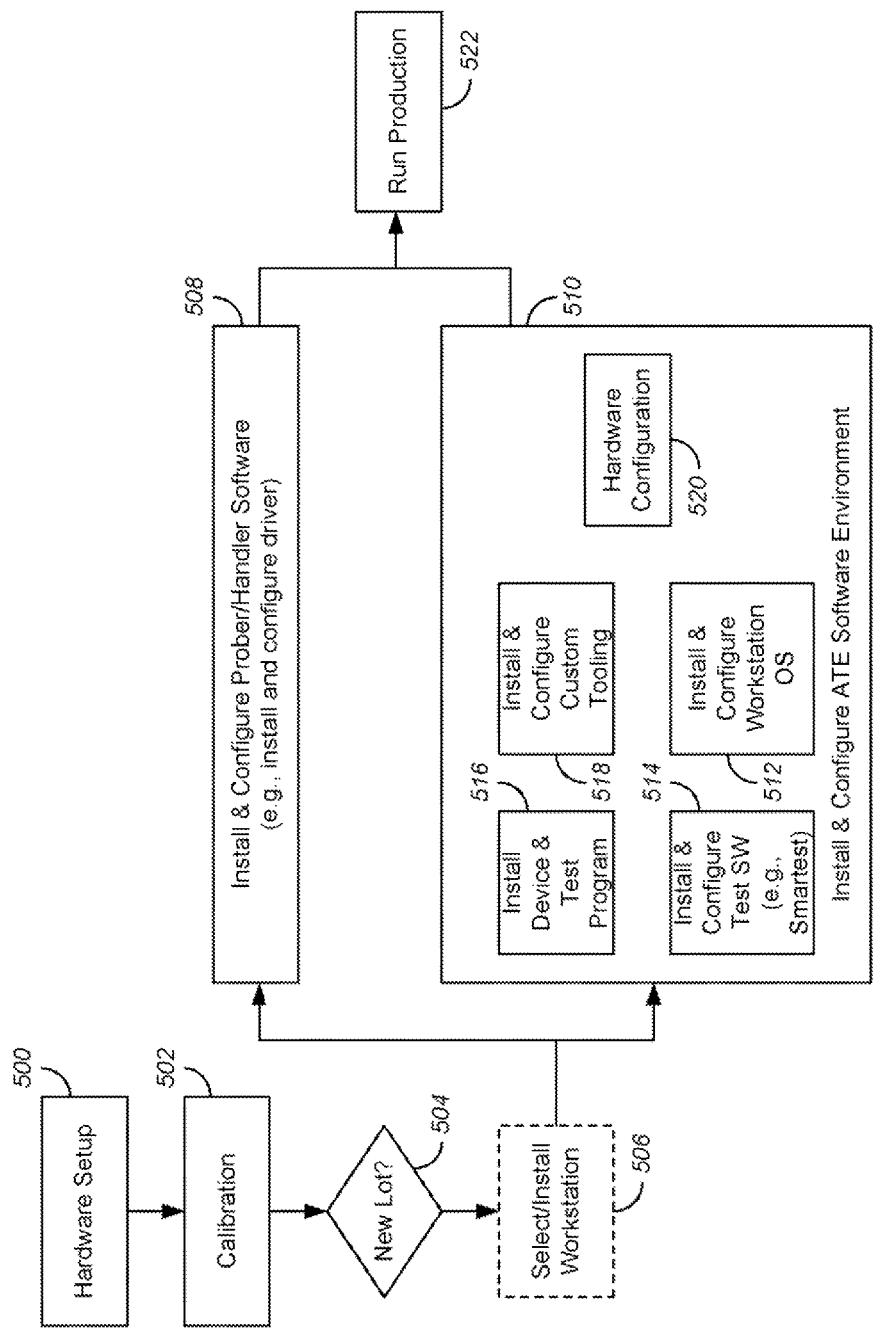
FIG. 5 illustrates an exemplary prior art way to install and configure a software environment for testing a semiconductor device.
Figure 6:
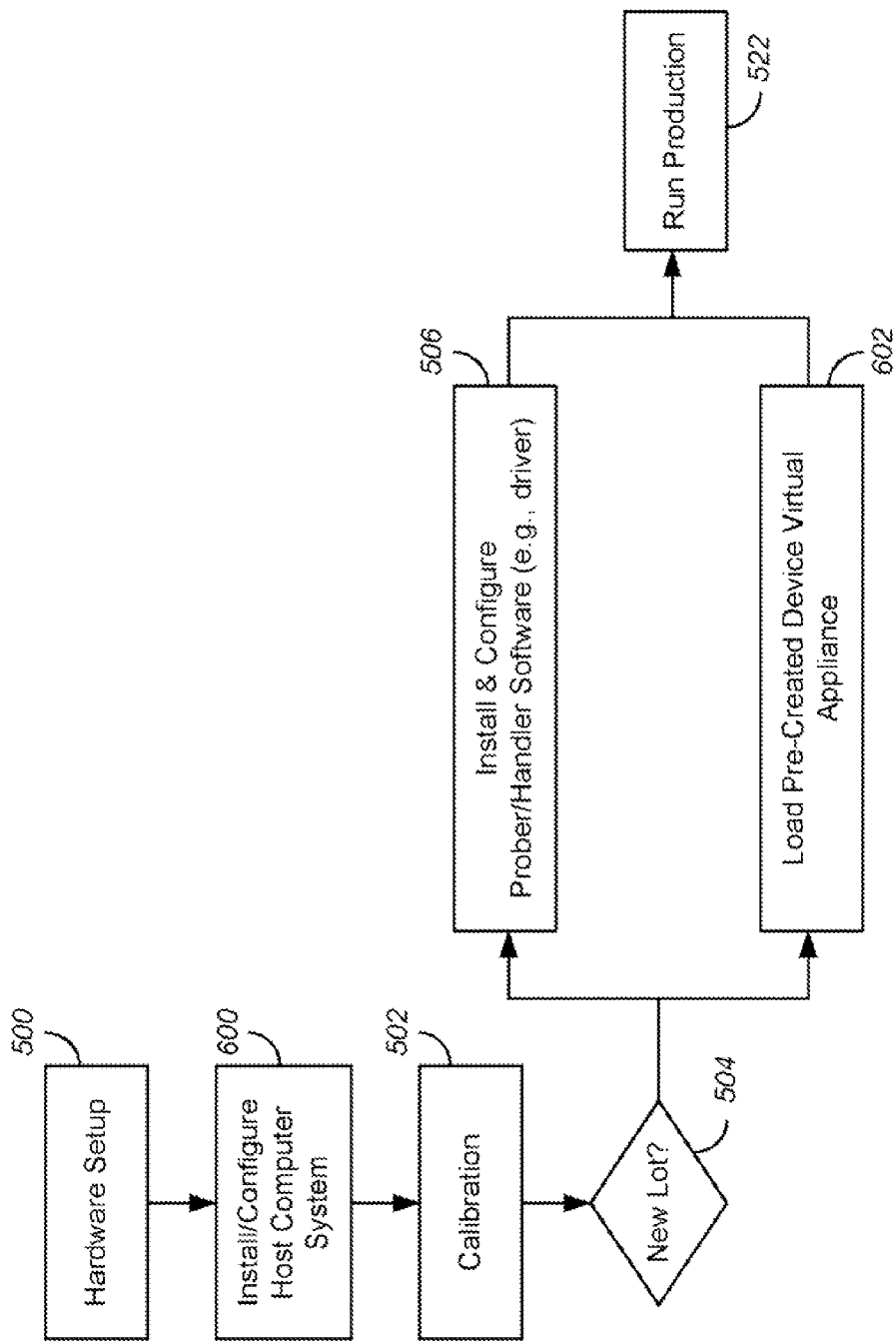
FIG. 6 illustrates an exemplary new way to install and configure a software environment for testing a semiconductor device.

In the past, the use of a single ATE system to test different types of devices required the installation and configuration of different software environments for different types of devices. For example, the production setup and production execution phases shown in FIG. 4 might have been implemented as shown in FIG. 5. As shown in FIG. 5, the ATE system and prober/handler hardware were first setup and calibrated (at blocks 500 & 502). Then, for each lot representing a change in the type of DUT being tested (shown at block 504), a new workstation might have needed to be selected and installed (at block 506). Software then needed to be installed and configured for controlling the prober/handler (at block 508), and software needed to be installed and configured for controlling the ATE system (at block 510). The latter might have comprised installing and configuring an operating system (at block 512), installing and configuring test software (at block 514), installing a device test program (at block 516), and installing and configuring custom tooling components (at block 518). As the installs and configurations were processed, additional hardware sometimes needed to be configured, or hardware configurations needed to be changed (at block 520), and additional software adjustments might have needed to be made. Frequently, version control issues arose. As a result, the installation and configuration of a new software environment could sometimes be very time consuming, delaying the start of production testing (at block 522). However, by incorporating the installation and configuration of some or all of the "stable" portions of the software environment into a test floor controller (i.e., by incorporating into the test floor controller those portions of the software environment that remain constant across all device types), and by incorporating the installation and configuration of all other portions of the software environment into a virtual appliance that remains loaded in memory (or which can be easily loaded into memory as a pre-created "memory image"), the selection/installation of different workstations for different lots of DUTs (at block 506) can be replaced with a one-time (or occasional) installation and configuration of a host computer system (e.g., installation and configuration of a test floor controller and hypervisor 110, at block 600, FIG. 6), and the functions performed in blocks 512-520 can be replaced with a simple switch to (or load) of a preconfigured virtual appliance (at block 602). If a host system is able to manage concurrently loaded virtual appliances, switching between the virtual appliances becomes even easier. And, as previously described, virtual appliances may sometimes be operated concurrently. If desired, the installation and configuration of the prober/handler software at block 506 can also be incorporated into the load of the virtual appliance at block 602.

In some cases, the loading of a virtual appliance image can be implemented by a "copy exact" load function, or nearly so—especially where the virtual appliance's host environment is well-characterized. When debugging of the virtual image load is necessary, it can be done by an engineer at a foundry or OSAT facility, by an engineer who designed (or who knows) the virtual appliance, or by a combination thereof. Also if the host environment is well-characterized, there is no effort or risk in allowing a virtual appliance to configure the software environment of a test program (e.g., Linux version, SmarTest version, custom tooling, etc.).

As previously discussed, one advantage of using virtual appliances to control one or more aspects of a test system is that a virtual appliance can be used by a semiconductor design company to securely deploy a proprietary device test program on the floor of a foundry or OSAT facility. A virtual appliance can also enable a semiconductor design company to use a common product engineering environment for both device design and test program development. After a device and its test program are developed, information on the device (and possibly the device design itself), the operating system needed to execute the test program, the version of ATE software needed to execute the test program, and other needed tools and libraries (e.g., custom tooling), can be packaged or compiled as a virtual appliance and transferred to a foundry or OSAT facility for production and test.

Figure 7:
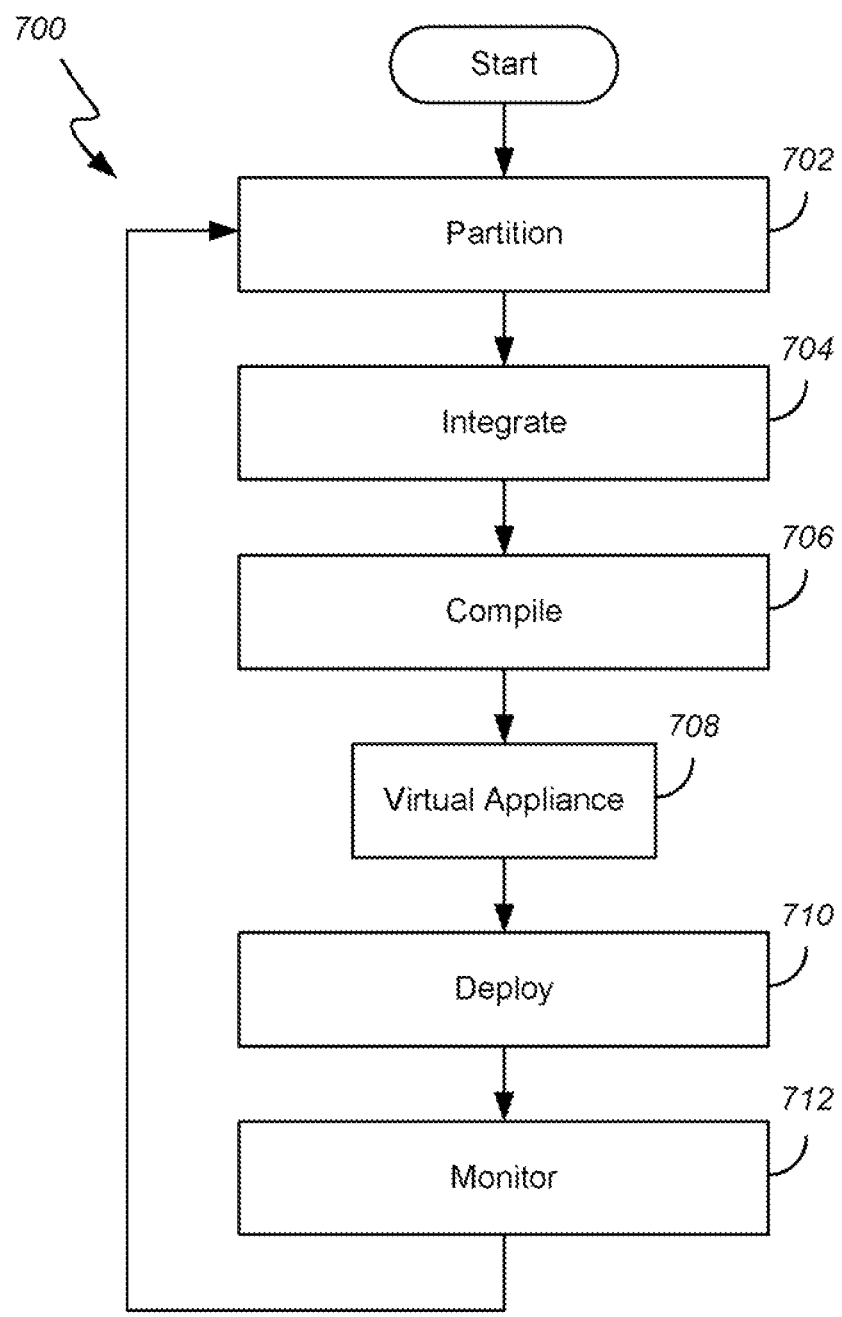
FIG. 7 illustrates an exemplary method for creating, deploying and communicating with a virtual appliance.

FIG. 7 illustrates an exemplary method 700 for creating, deploying and communicating with a virtual appliance. The method 700 includes a partitioning step 702, in which: the role or roles of a virtual appliance's components may be determined and specified (i.e., partitioned); licensing requirements of a virtual appliance may be specified; a device test program and performance estimation (PE) tool may be created; and deployment parameters like required hardware and software versions may be specified. At block 704, the core functions of the virtual appliance are integrated with support functions, such as: network security components for remote access; network routing information; datalog server access; and data storage access. The support and core functions are then compiled into a virtual appliance 708 (at block 706). Deployment of the virtual appliance 708 may comprise downloading the virtual appliance 708 to a foundry or OSAT facility, loading the virtual appliance 708 on a host system, and then checking and correcting the configuration of the virtual appliance 708, as necessary (at block 710). Once deployed, the virtual appliance may be monitored (at block 712) by means of its integrated support functions and its use of a virtual set of hardware resources of the computer system on which it is deployed. Because of the virtual integration of a device's development cycle (provided by the virtual appliance 708), a deployed and monitored virtual appliance 708 can be modified, as desired, by its creator or manager.

In some cases, the steps of the method 700 shown in FIG. 7 may be performed in other orders, or the method 700 may be performed with more or fewer steps.

Figure 8:
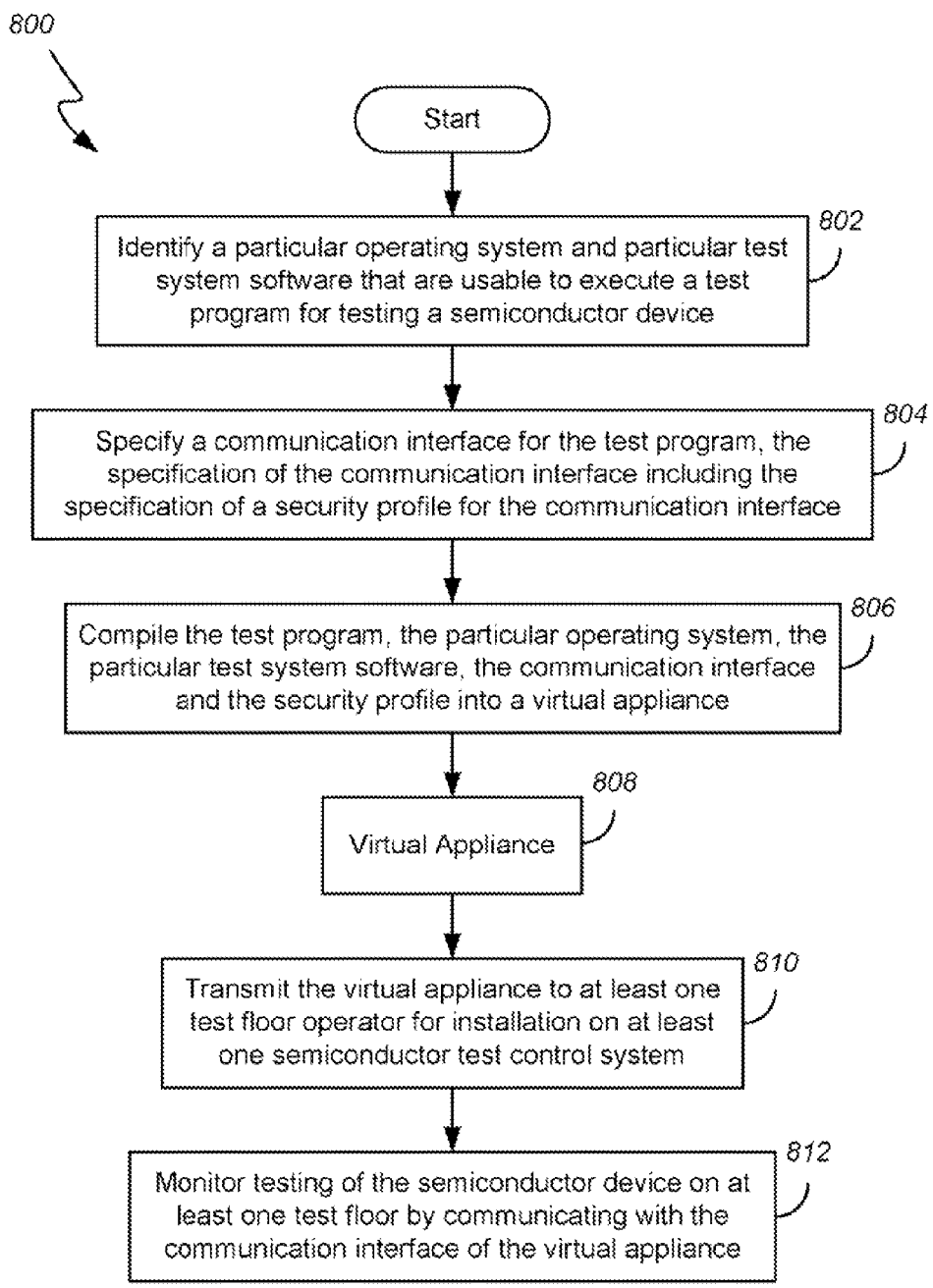
FIG. 8 illustrates a second exemplary method for creating, deploying and communicating with a virtual appliance.

FIG. 8 illustrates a second exemplary method 800 for creating, deploying and communicating with a virtual appliance. In step 802, a particular operating system and particular test system software are identified. The particular operating system and test software are usable in executing a test program for testing a semiconductor device. In step 804, a communication interface is specified for the test program. The specification of the communication interface includes the specification of a security profile for the communication interface. In some cases, the security profile may be specified explicitly. In other cases, the security profile may be specified implicitly, or by default, by specification of the communication interface. In step 806, the test program, the particular operating system, the particular test system software, the communication interface, and the security profile are compiled into a virtual appliance 808. In some cases, other elements may be compiled into the virtual appliance 808. In step 810, the virtual appliance is transmitted to at least one test floor operator for installation on at least one semiconductor test control system. The transmission may be carried out electronically, by physically sending a computer readable media, or in other ways. In step 812, testing of the semiconductor device on at least one test floor is monitored, and in some cases controlled, by communicating with the communication interface of the virtual appliance. The communication may be direct, between a user's computer and the virtual appliance, or indirect (e.g., by way of intermediary computers or devices).

All of the steps of the method 800 may be performed using one or more computer systems. If performed using one or more computer systems, the steps may be carried out automatically, or in response to user input. In some embodiments, one or more steps of the method may be performed manually. For example, the step of transmitting the virtual appliance to the test floor operator may be carried out by physically sending the test floor operator a computer readable media with the virtual appliance thereon.

It was mentioned that "other elements" can be compiled into the virtual appliance in step 806. One of these elements is a correlation engine. Thus, in some embodiments, the method 800 may further comprise a step of specifying a correlation engine to i) monitor execution of the test program, and ii) in response to the execution monitoring, adjust an execution parameter of the test program. The specified correlation may then be compiled into the virtual appliance. As previously noted, the execution parameter may be, for example, a test program execution speed or a test program memory allocation.

Another element that can be compiled into the virtual appliance in step 806 is custom tooling. Thus, in some embodiments, the method 800 may further comprise a step of specifying custom tooling components to be used during execution of the test program. The specified custom tooling components may then be compiled into the virtual appliance. By way of example, the custom tooling components may comprise 1) software tools that have been developed by (or are used by) a particular semiconductor design company or test developer, 2) third-party software needed to run a particular virtual appliance, or 3) software-based controls or configurations for custom hardware (tooling) that an OSAT or foundry needs to use when testing a particular type of DUT. The custom hardware may comprise, for example, components on, or interfaces to, a probe card or load board.

In some embodiments of the method 800, the step of transmitting the virtual appliance to at least one test floor operator for installation on at least one semiconductor test control system comprises transmitting the virtual appliance to at least one test floor operator for installation on a plurality of semiconductor test control systems. In these embodiments of the method 800, the method 800 may comprise a step of monitoring testing of semiconductor devices by a plurality of semiconductor test systems, by communicating with the communication interfaces provided by a plurality of installations of the virtual appliance.

Figure 9:
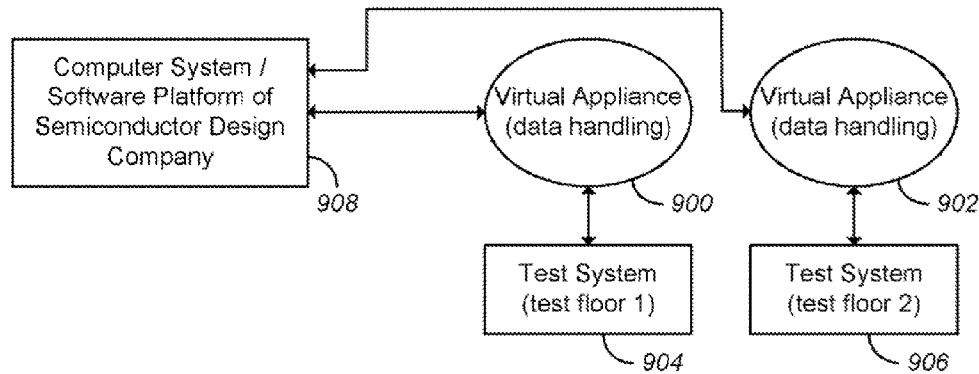
FIG. 9 illustrates an exemplary plurality of virtual appliances having common remote access interfaces, wherein the virtual appliances are deployed across multiple test floors.

Another advantage of using virtual appliances is shown in FIG. 9, where a plurality of virtual appliances 900, 902 having common remote access interfaces are deployed to control or monitor semiconductor test systems 904, 906 on different test floors (e.g., test systems on the test floors of multiple foundries or OSAT facilities), thereby enabling a semiconductor design company 908 or other party to receive, analyze, compare or aggregate data across multiple test floors. The virtual appliances 900, 902 make this data aggregation possible despite the test floors' possible use of different host system hardware, different test floor controllers, and different semiconductor test systems 904, 906. The virtualization of resources provided by the hypervisor(s) of one or more computer systems also ensures that data aggregation achieved by a semiconductor design company 908 or other party does not lead to security breaches between competing parties (e.g., between competing design companies, or between a design company and a foundry or OSAT facility).

Figure 10:
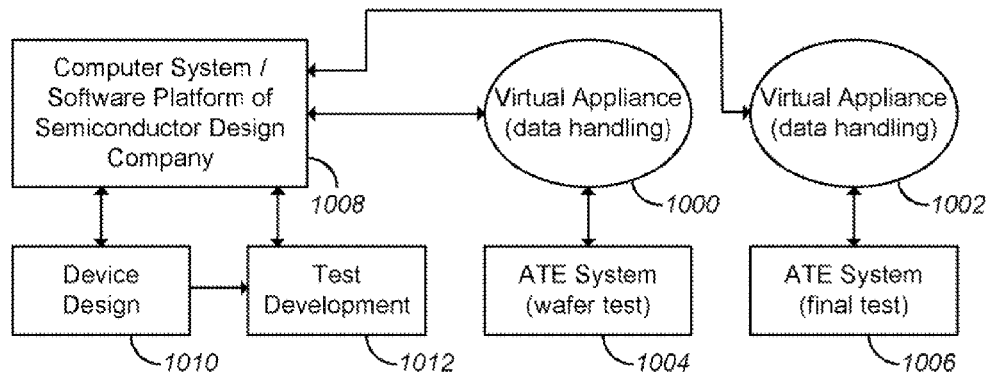
FIG. 10 illustrates an exemplary plurality of virtual appliances having common remote access interfaces, wherein the virtual appliances are deployed across different insertion points of a test phase.

A plurality of virtual appliances 1000, 1002 having common remote access interfaces may also be deployed at different insertion points in a device's test phase or development cycle. For example, and as shown in FIG. 10, virtual appliances 1000, 1002 may be deployed at wafer test and final test insertion points 1004, 1006 (e.g., at one or more ATE systems used for wafer test 1004, and at one or more ATE systems used for final test 1006). In this manner, virtual integration of a semiconductor device's development cycle may be achieved. For example, data obtained from the virtual appliances 1000, 1002 and provided to a computer system 1008 of a semiconductor design company (or third party) may be used to modify a device design 1010, its packaging, or its test program 1012. Data obtained from the virtual appliances 1000, 1002 may also be used to make adjustments to equipment or processes in the fabrication, assembly or test phases of a device's development cycle. Or, once a device design 1010 or test program 1012 has been modified, the modified device design 1010 or test program 1012 may be provided to the fabrication, assembly or test phases (e.g., to fabricate, assemble or test devices in accord with a modified device design 1010 or test program 1012).

The data aggregation facilitated by the virtual appliances 900, 902, 1000, 1002 shown in FIGS. 9 & 10 also enables centralized yield learning. Once again, the virtualization of resources provided by the hypervisor(s) of one or more computer systems ensures that the flow of yield data to a semiconductor design company or other party does not lead to security breaches between competing parties. The virtual appliances can also ensure that yield data is returned to the semiconductor design company in a form that is easily accepted into the software platform used by the semiconductor design company.

Figure 11:
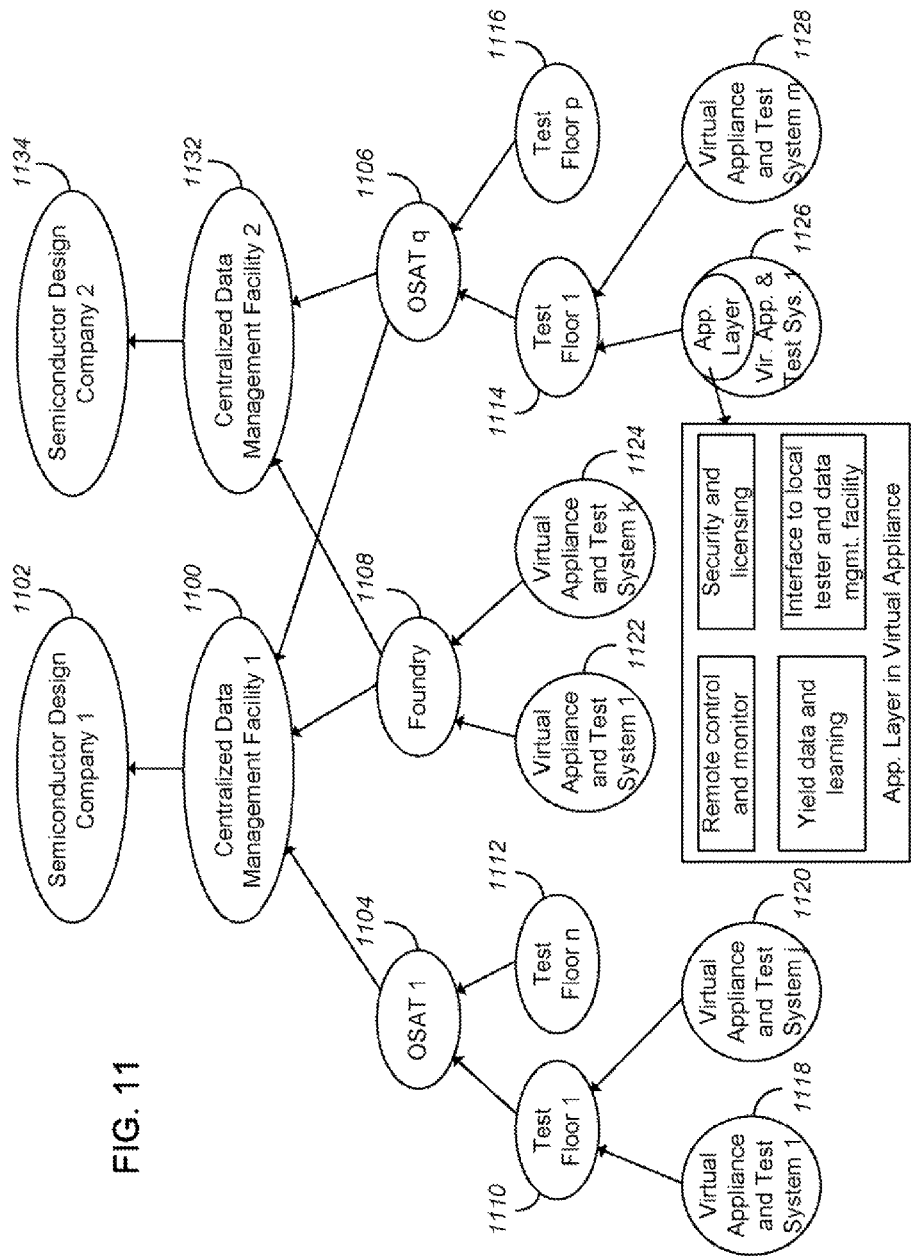
FIG. 11 illustrates an exemplary centralized data management facility that combines data from two OSAT facilities and a foundry.

In some cases, the data provided by one or more virtual appliances may be provided to a centralized data management facility, such as a centralized server, data processing center, data processing cloud, or blade farm. The centralized data management facility may simply store the data, or may process or analyze the data. The centralized data management facility may be owned or managed by a semiconductor design company or other party. FIG. 11 illustrates an exemplary centralized data management facility 1100 that combines data from two OSAT facilities 1104, 1106 and a foundry 1108. Data is first aggregated at a number of test floor levels 1110, 1112, 1114, 1116, then also at the OSAT facility 1104, 1106 and foundry 1108 levels. Finally, the data is aggregated and centrally managed at the data management facility 1100. The centralized data management facility 1100 may comprise a collection of virtualized servers, processors or other resources. In this manner, the data received from a plurality of virtual appliances and their test systems 1118, 1120, 1122, 1124, 1126, 1128 is hierarchically aggregated. Data processing and analysis may be performed at the centralized data management facility 1100, or at any other level in the aggregation hierarchy. Alternately, or additionally, access to the data can be provided to a semiconductor design company 1102 or other party—for purposes such as, for example, processing or analysis of the data by the other party, or for mere reporting of data or analysis results to the other party (e.g., for a monitoring purpose).

FIG. 11 also illustrates the aggregation of data at a second centralized data management facility 1130, which second centralized data management facility 1132 may be accessed by a second semiconductor design company 1134.

Note that some participants in the data aggregation hierarchy shown in FIG. 11 may provide some or all of their data to multiple parties for aggregation. For example, the foundry 1108 provides some or all of its data to each of the data management facilities 1100 and 1132.

FIG. 11 also illustrates exemplary components of an application layer of a virtual appliance. The exemplary components comprise a remote control and monitor component; a security and licensing component; a yield data and learning component; and an interface to a local tester and centralized data management facility.

Figure 12:
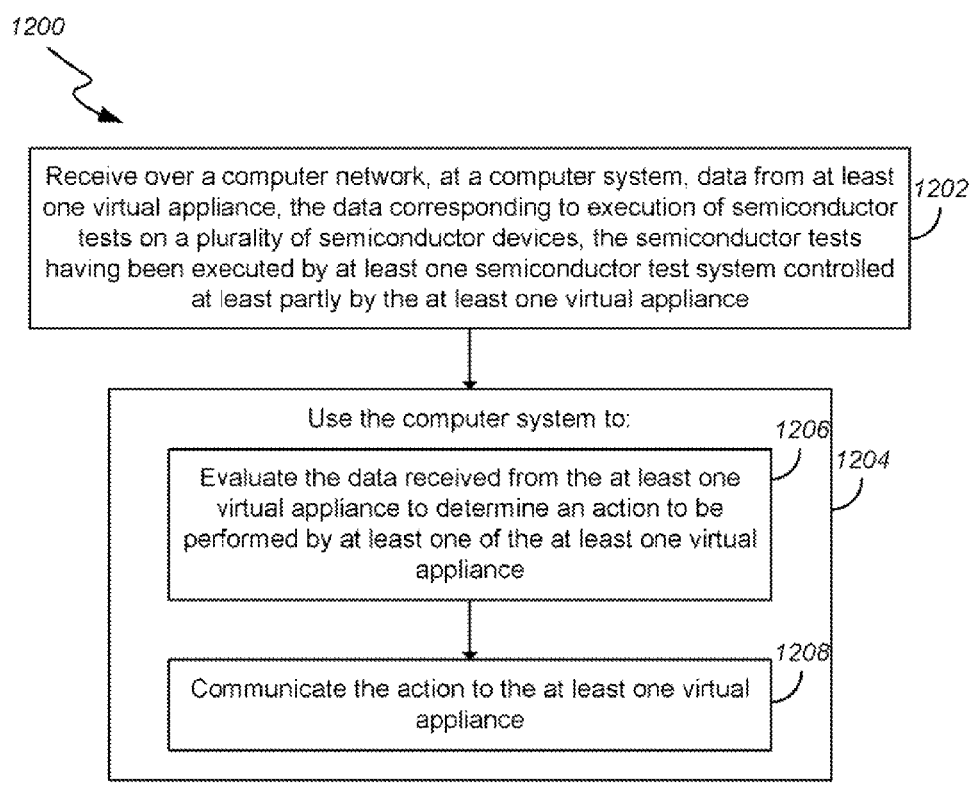
FIG. 12 illustrates an exemplary method for implementing some or all of the functions conveyed by FIGS. 9-11.

FIG. 12 illustrates a method 1200 for implementing some or all of the above principles. The method 1200 comprises receiving, over a computer network, data from a plurality of virtual appliances (at block 1202). The data is received at a computer system and corresponds to execution of semiconductor tests on a plurality of semiconductor devices, wherein the semiconductor tests were executed by a plurality of semiconductor test systems controlled at least partly by respective ones of the virtual appliances. The method 1200 continues as the computer system is used (at block 1204) to 1) evaluate the data received from the plurality of virtual appliances (at block 1206), and 2) identify from the evaluated data an adjustment to a development cycle of at least a first subset of the plurality of semiconductor devices (at block 1208).

In some implementations of the method 1200, the data received at the computer system may correspond to semiconductor tests that were executed by a plurality of semiconductor test systems located on different test floors, as shown in FIG. 7. The data may then be evaluated by the computer system to determine a difference between the data received from two or more of the test floors. In other implementations of the method 1200, the data received at the computer system may correspond to semiconductor tests that were executed by a plurality of semiconductor test systems at different insertion points of a test phase, as shown in FIG. 8. The data may then be evaluated by the computer system to determine a difference between the data received from two or more of the insertion points. In any case, the differences in data received from different virtual appliances may be, for example, differences in the results of similar semiconductor tests, or differences in the yield loss of semiconductor devices tested at the different virtual appliances. In some cases, evaluating the data received from different virtual appliances may comprise correlating the data.

The development cycle adjustment identified by the method 1200 may take various forms, and even multiple forms. In some cases, the adjustment may comprise, for example, an adjustment to the design of the semiconductor devices being tested. In other cases, the adjustment may comprise an adjustment in a semiconductor fabrication step or an adjustment in a semiconductor assembly step. The semiconductor fabrication or assembly step may be a step that affects the fabrication or assembly of devices on a "global" basis (i.e., a step that affects the fabrication or assembly of devices at all of a number of similarly situated fabrication or assembly locations). Alternately, the semiconductor fabrication or assembly step may be a step that affects the fabrication or assembly of devices on a "local" basis (i.e., a step that affects the fabrication or assembly of devices at only one or a subset of similarly situated fabrication or assembly locations). Adjustments in this latter case may be made to overcome, for example, the miscalibration of a single test system (or the need to correlate the results of one test system with those of another test system).

In still other cases, the adjustment identified by the method 1200 may be an adjustment to a test program executed by at least one virtual appliance. For example, the limits of a test executed at a particular insertion point may be adjusted. Or, for example, a test may be added to (or deleted from) the test program performed at a particular insertion point.

In yet other cases, the adjustment identified by the method 1200 may be an adjustment to one or more of the semiconductor test systems that are controlled by the virtual appliances. For example, an adjustment may be made to a particular semiconductor test system where yield loss is higher than expected.

Figure 13:
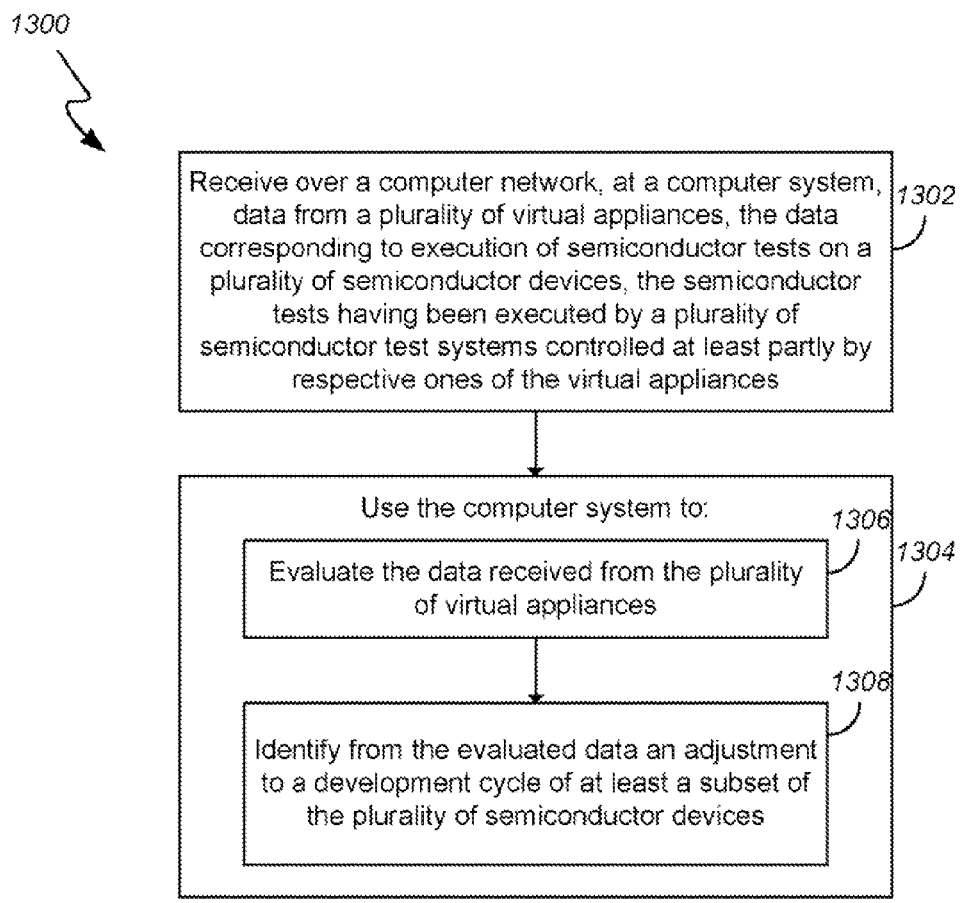
FIG. 13 illustrates a second exemplary method for implementing some or all of the functions conveyed by FIGS. 9-11.

FIG. 13 illustrates another exemplary method 1300 for implementing some or all of the principles disclosed in this disclosure. The method 1300 comprises receiving, over a computer network, data from at least one virtual appliance (at block 1302). The data is received at a computer system and corresponds to execution of semiconductor tests on a plurality of semiconductor devices, wherein the semiconductor tests were executed by a plurality of semiconductor test systems controlled at least partly by the at least one virtual appliance. The method 1300 continues as the computer system is used (at block 1304) to 1) evaluate the data received from the at least one virtual appliance to determine an action to be performed by at least one virtual appliance (at block 1306), and 2) communicating the action to be performed to the at least one virtual appliance (at block 1308).

Similarly to the method 1200, the data received in accord with the method 1300 may in some cases correspond to semiconductor tests that were executed by a plurality of semiconductor test systems located on different test floors, as shown in FIG. 7. The data may then be evaluated by the computer system to determine a difference between the data received from two or more of the test floors. In other implementations of the method 1300, the data received at the computer system may correspond to semiconductor tests that were executed by a plurality of semiconductor test systems at different insertion points of a test phase, as shown in FIG. 8. The data may then be evaluated by the computer system to determine a difference between the data received from two or more of the insertion points. In any case, the differences in data received from different virtual appliances may be, for example, differences in the results of similar semiconductor tests, or differences in the yield loss of semiconductor devices tested at the different virtual appliances. In some cases, evaluating the data received from different virtual appliances may comprise correlating the data.

In either of the methods 1200 or 1300, an action to be performed by a first virtual appliance may be determined by evaluating data received from a second virtual appliance. By way of example, the action to be performed by the first virtual appliance may be the characterization of one or more semiconductor die, or the adjustment of an execution parameter of a test program of the first virtual appliance. For example, a die being tested under the control of a particular virtual appliance may be characterized as good or bad, or in other ways, based on data provided by an upstream virtual appliance that tested the die at another insertion point in the test phase. Or, for example, a die being tested under the control of a particular virtual appliance may be characterized as good or bad, or in other ways, based on data provided by a virtual appliance testing similar dies on another test floor. Such might be the case if miscalibration of a test system (or miscorrelation of test results) is expected or is possible.

In still other cases, a die being tested under the control of a particular virtual appliance may be characterized as good or bad, or in other ways, based on data provided by a virtual appliance operated by a common test floor controller. For example, consider a wafer or load board carrying different types of semiconductor devices that are being tested in an engineering or low-volume production run. Even though different virtual appliances may be used to test different device types, it is sometimes desirable to characterize a device, or device measurement, in the context of i) measurements acquired from different physical positions on a wafer or load board, or ii) measurements acquired from different test pins of a tester.

Some of the advantages that the computer system 102 shown in FIG. 1 provides to a foundry or OSAT facility have already been disclosed. These advantages include the ability to allocate or schedule the use of its equipment to achieve optimum utilization of its equipment. Optimum equipment utilization includes not only utilization of computing resources (e.g., the sharing of a single computer system or controller to control and monitor one or a group of test systems), but also the utilization of test systems (e.g., the use of ATE systems to test different types of devices more or less concurrently). For example, the use of virtual appliances that are relatively easily loaded enables a foundry or OSAT facility to prioritize, and more readily switch between, high priority test (or high volume manufacturing (HVM) production test) and low priority test (e.g., engineering test).

Another advantage of using virtual appliances is that it increases a foundry or OSAT facility's ability to serve more customers and meet more and varied test requests, because the foundry or OSAT facility can execute more and varied types of test programs within different virtual appliances, without worrying about operational inefficiencies or conflicts with other device test programs. A foundry or OSAT facility may also execute legacy software within a virtual appliance. And, for legacy software or test programs that need to be slowed down, a host system can be instructed (e.g., by a virtual appliance or its provider) to execute the legacy software, the test program, or parts thereof at a slower execution speed.

In some cases, the migration of highly variable and device dependent control functions into virtual appliances can enable a foundry or OSAT facility to provide other (e.g., common) functionality in a more stable environment. On the other hand, the use of virtual appliances can also motivate foundries and OSAT facilities to upgrade to the latest versions of test systems and their controllers, because doing so allows them to 1) vie for cutting-edge customers using the most current test development platforms, while 2) maintaining legacy customers by executing their software within virtual appliances. However, despite equipment upgrades, the test floor controller may remain stable, such that it is able to support any virtual appliance that is deployed on a test floor. Also, the same type/version of test floor controller may be deployed across all of the computer systems and controllers of a test floor. This not only provides a stable and consistent execution environment for all virtual appliances, but the commonality of test floor controllers tends to lower software maintenance costs.

Virtualization of resources can also provide redundancy, so that if one resource fails (whether it be a computing resource or a test resource), a new resource can be swapped in to replace the failed resource. Virtualization also provides for better management of the loads that are placed on each resource in a pool.

Figure 14:
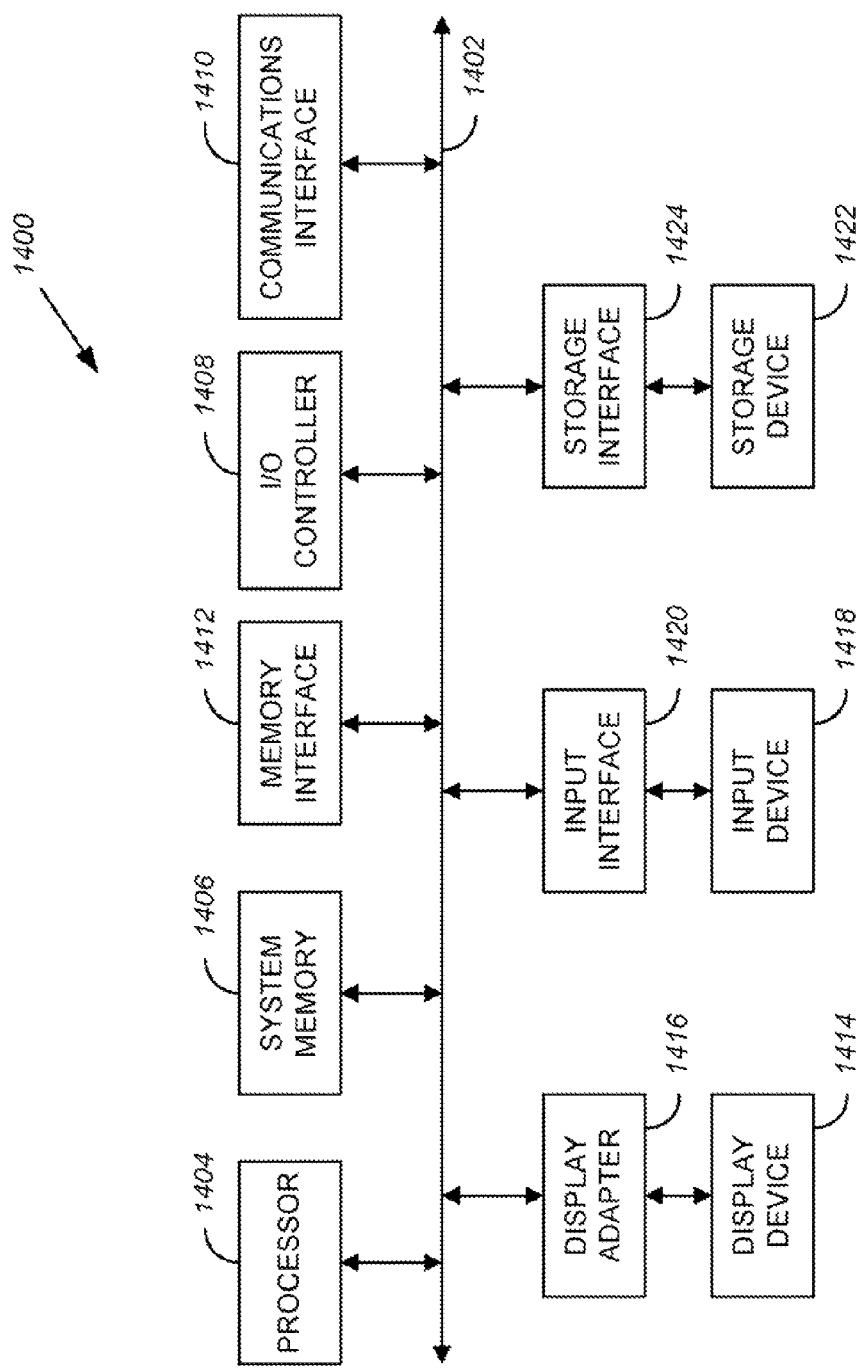
FIG. 14 provides a block diagram of an exemplary computer system that can be used to host the hypervisor, virtual appliances and test floor controller shown in FIG. 1 and elsewhere.

FIG. 14 provides a block diagram of an exemplary computer system 1400 that can be used to host the hypervisor, virtual appliances and test floor controller described herein. The computer system 1400 generally represents any single or multi-processor computing device that is capable of executing single-threaded or multi-threaded applications. The computer system 1400 may include a communication infrastructure 1402 that interconnects the major subsystems of the computer system 1400. The communication infrastructure 1402 generally represents any form or structure that is capable of facilitating communication between one or more electronic components; including, for example, a communication bus (e.g., ISA, PCI, PCI-E, AGP, etc.) or a network.

As illustrated in FIG. 14, the exemplary computer system 1400 may comprise a processor 1404, a system memory 1406, an Input/Output (I/O) controller 1408, a communication interface 1410, and a memory interface 1412. The processor 1404 generally represents any type or form of CPU or other computing device that is capable of interpreting instructions and processing data. The instructions provided to the processor 1404 may cause the processor 1404 to perform the functions of one or more of the hypervisor, virtual appliances or test floor controller described and/or illustrated herein. The instructions provided to the processor 1404 may be instructions from a software application or module, and the hypervisor, virtual appliances or test floor controller described herein may be implemented as instructions in one or more software applications or modules. The processor 1404 may execute, or assist in executing, various of the methods described herein. For example, the processor 1404 may execute, and/or be a means for executing, either alone or in combination with other elements, one or more of the actions or functions performed by the hypervisor, virtual appliances or test floor controller described herein. The processor 1404 may also perform and/or be a means for performing various other steps or processes described and/or illustrated herein.

The system memory 1406 generally represents any type or form of storage device or medium capable of storing data and/or other computer-readable instructions. Examples of system memory 1406 include, without limitation, a random access memory (RAM) unit, a read only memory (ROM) unit, a flash RAM unit, or any other suitable memory device. In certain embodiments, the system memory 1406 may be used, for example, to store data. The I/O controller 1408 generally represents any type or form of computer board or module that is capable of coordinating and/or controlling the input and output functions of a computing device. The I/O controller 1408 may be used, for example, to perform and/or be a means for performing, either alone or in combination with other elements, one or more of the actions or functions performed by the hypervisor, virtual appliances or test floor controller described herein. The I/O controller 1408 may also be used to perform and/or be a means for performing other steps and features set forth herein.

The communication interface 1410 generally represents a communication device capable of facilitating communication between the exemplary computer system 1400 and an additional device or devices. For example, in certain embodiments, the communication interface 1410 may interconnect the computer system 1400 with one or more components of a semiconductor test system, as well as with a private or public network comprising additional computer systems. Examples of the communication interface 1410 include, without limitation, a network interface (such as a network interface card), a wireless card, a modem, a communications port (such as a USB or Firewire port), and any other suitable interface. In at least one embodiment, the communication interface 1410 may provide a direct connection to a remote server via a direct network link to the Internet. The communication interface 1410 may also provide a connection through, for example, an Ethernet connection, a modem, a digital cellular telephone connection, a BLUETOOTH network, an IEEE 802.11x wireless network, a digital satellite data connection, or any other suitable connection.

The communication interface 1410 may allow the computer system 1400 to engage in distributed or remote computing. For example, the communication interface 1410 may receive instructions from a remote computer, or communication interface 1410 may send instructions to a remote computer or test system for execution. Accordingly, the communication interface 1410 may perform and/or be a means for performing, either alone or in combination with other elements, one or more of the actions or functions of the hypervisor, virtual appliances or test floor controller described herein. The communication interface 1410 may also be used to perform and/or be a means for performing other steps and features set forth in the instant disclosure.

The memory interface 1412 generally represents any type or form of device that is capable of allowing software and data to be transferred between a storage device and other components of the computer system 1400. For example, memory interface 1412 may comprise a cartridge interface, a memory socket, or a disk drive. Memory interface 1412 may also be a floppy drive, an optical disk drive, a flash interface, or any other type of memory interface. In certain embodiments, the memory interface may perform and/or be a means for performing, either alone or in combination with other elements, one or more of the actions or functions performed by the hypervisor, virtual appliances or test floor controller described herein. The memory interface 1412 may also be used to perform and/or be a means for performing other steps and features described and/or illustrated herein.

As illustrated in FIG. 14, the computer system 1400 may also comprise at least one display device 1414 that is coupled to the communication infrastructure 1402 via a display adapter 1416. The display device 1414 generally represents any type or form of device that is capable of visually displaying information forwarded by the display adapter 1416. Similarly, the display adapter 1416 generally represents any type or form of device that is configured to forward graphics, text, and other data from communication infrastructure 1402 (or from a frame buffer, as known in the art) for display on the display device 1414. Examples of the display device 1414 include, without limitation, CRT monitors, LCD screens, plasma screens, video projectors, and the like.

As illustrated in FIG. 14, exemplary computer system 1400 may also comprise at least one input device 1418 coupled to communication infrastructure 1402 via an input interface 1420. Input device 1418 generally represents any type or form of user input device capable of providing input, either computer or human generated, to exemplary computer system 1400. Examples of input device 1418 include, without limitation, a keyboard, a pointing device, a speech recognition device, or any other input device. In at least one embodiment, input device 1418 may perform and/or be a means for performing, either alone or in combination with other elements, one or more of the receiving, accessing, determining, verifying, modifying, preventing, creating, encrypting, decrypting, password-protecting, limiting, providing, terminating, calculating, applying, generating, transmitting, communicating, and/or storing steps described herein. Input device 1418 may also be used to perform and/or be a means for performing other steps and features set forth in the instant disclosure.

As illustrated in FIG. 14, the exemplary computer system 1400 may also comprise a storage device 1422 that is coupled to the communication infrastructure 1402 via a storage interface 1424. The storage device 1422 generally represents any type or form of storage device or medium that is capable of storing data and/or other computer-readable instructions. For example, the storage device 1422 may be a magnetic disk drive (e.g., a so-called hard drive), a floppy disk drive, a magnetic tape drive, an optical disk drive, a flash drive, or the like. In certain embodiments, the storage device 1422 may be configured to read from and/or write to a removable storage unit that is configured to store computer software, data, or other computer-readable information. Examples of suitable removable storage units include, without limitation, a floppy disk, a magnetic tape, an optical disk, a flash memory device, or the like. The storage device 1422 may also comprise other similar structures or devices for allowing computer software, data, or other computer-readable instructions to be loaded into the computer system 1400. For example, the storage device 1422 may be configured to read and write software, data, or other computer-readable information. The storage device 1422 may also be a part of the computer system 1400 or may be a separate device that is accessed through other interface systems. In certain embodiments, the storage device 1422 may be used, for example, to perform and/or be a means for performing, either alone or in combination with other elements, one or more of the actions or functions of the hypervisor, virtual appliances or test floor controller described herein. The storage device 1416 may also be used to perform and/or be a means for performing other steps and features set forth in the instant disclosure.

In certain embodiments, the computer system 1400 may be any kind of computing device, including a server, a blade farm or a network appliances. The computer system 1400 may also be any type of device that is configured to execute the functions and modules described and/or illustrated herein. The computer system 1400 may be a source computer, a destination computer, a server, or any other computing device discussed herein. The operating system provided on computer system 1400 may be WINDOWS, UNIX, Linux, or any other operating system or platform. The computer system 1400 may also support a number of Internet access tools; including, for example, an HTTPcompliant web browser having a JavaScript interpreter, such as Netscape Navigator, Microsoft Internet Explorer, or other similar navigators.

Many other devices or subsystems may be connected to the computer system 1400. Conversely, all of the devices shown in FIG. 14 need not be present to practice the embodiments described and/or illustrated herein. The devices and subsystems referenced above may also be interconnected in different ways from that shown in FIG. 14. Indeed, the computer system 1400 may use any number of software, firmware, and/or hardware configurations. For example, one or more of the hypervisor, virtual appliances or test floor controller disclosed herein may be encoded as a computer program (also referred to as computer software, software applications, computer-readable instructions, or computer control logic) and stored in a computer-readable medium. The computer-readable medium containing the computer program may then be loaded into the computer system 1400 using a removable storage drive, or downloaded to the computer system 1400 via the communication interface 1410 over a communication path, such as the Internet or other network. All or a portion of the computer program stored on the computer-readable medium may then be stored in system memory 1406 and/or various portions of the storage device 1422. According to certain embodiments, a computer readable medium may be an optical storage device, a magnetic storage device, or any other physical storage device capable of storing computer readable instructions. When executed by the processor 1404, a computer program loaded into the computer system 1400 may cause the processor 1404 to perform and/or be a means for performing the actions or functions of the hypervisor, virtual appliances or test floor controller described herein. Additionally or alternatively, one or more of the exemplary embodiments described and/or illustrated herein may be implemented in firmware and/or hardware. For example, one or more of the exemplary embodiments disclosed herein may be implemented using various hardware components such as, for example, application specific integrated circuits (ASICs).

The preceding description has been provided to enable others skilled in the art to best utilize various aspects of the exemplary systems, methods and apparatus described herein. This exemplary description is not intended to be exhaustive or to be limited to any precise form disclosed. Many modifications and variations are possible without departing from the spirit and scope of the instant disclosure. It is desired that the embodiments described herein be considered in all respects illustrative, and not restrictive, and that reference be made to the appended claims and their equivalents for determining the scope of the instant disclosure.

While the foregoing disclosure sets forth various embodiments using specific block diagrams, flowcharts, and examples, each block diagram component, flowchart step, operation and/or component described and/or illustrated herein may be implemented, individually and/or collectively, using a wide range of hardware, software, or firmware (or any combination thereof) implementations.

The foregoing disclosure also describes embodiments including components contained within other components. Such architectures are merely examples, and many other architectures can be implemented to achieve the same functionality. For example, one or more of the components or devices described and/or illustrated herein may be combined into a single component or device and/or separated into a plurality of components or devices. Similarly, the process parameters and sequences of steps described and/or illustrated herein are given by way of example only and can be varied as desired. For example, while the steps illustrated and/or discussed herein may be shown or discussed in a particular order, these steps do not necessarily need to be performed in the order illustrated or discussed. In addition, the various exemplary methods described and/or illustrated herein may omit one or more of the steps described or illustrated herein or include additional steps in addition to those described or illustrated.

Furthermore, while various embodiments have been described and/or illustrated herein in the context of fully functional computer systems, one or more of the exemplary embodiments described and/or illustrated herein may be capable of being distributed as a program product in a variety of forms, regardless of the particular type of signal bearing media used to actually carry out the distribution. Examples of signal bearing media include recordable media such as floppy disks and CD-ROMs, transmission type media such as digital and analog communications links, as well electronic storage media, magnetic storage media, optical storage media, communications medium conveying signals encoding instructions, and other distribution systems.

In addition, one or more of the embodiments described and/or illustrated herein may be implemented using software modules and scripts that perform certain tasks. The software modules and scripts discussed herein may include script, batch, or other executable files. In addition, these software modules and scripts may be stored on a machine-readable or computer-readable storage medium, such as a disk drive. In some embodiments, the modules and scripts can be stored within a computer system memory to configure the computer system to perform the functions of the module. One or more of the steps discussed herein may be automated by a computer. In some embodiments, all of the steps performed by a module or application may be automated by a computer.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising." Furthermore, a hardware or software component that is "configured" to provide or do something is configured to assume a particular state to provide or do something. Language that follows the phrase "configured to" is not merely a recitation of an intended use.

What is claimed is:

1. A semiconductor test control system, comprising:
   a computer system having a plurality of hardware resources;
   a hypervisor installed on the computer system, the hypervisor virtualizing the hardware resources and providing each of at least two different virtual appliances with access to a different respective virtual set of the hardware resources, each of the different virtual set of the hardware resources placing a respective one of the different virtual appliances in controlling communication with at least a first aspect of the semiconductor test system that relate to execution of a test program for a particular type of semiconductor device, thereby enabling the respective virtual appliance to test a respective type of semiconductor device; and
   a test floor controller installed on the computer system, the test floor controller in controlling communication with i) at least a second aspect of the semiconductor test system, wherein the second aspect of the semiconductor test system differs from the first aspect of the semiconductor test system, and ii) each of the different virtual appliances to operate each respective virtual appliance.

2. The semiconductor test control system of claim 1, wherein a particular virtual set of the hardware resources of the computer system provides a virtual user interface between a particular virtual appliance and a user of the particular virtual appliance.

3. The semiconductor test control system of claim 1, wherein the hypervisor provides the test floor controller with access to a respective virtual set of the hardware resources of the computer system, and wherein the virtual set of the hardware resources provided to the test floor controller places the test floor controller in controlling communication with the at least second aspect of the semiconductor test system.

4. The semiconductor test control system of claim 3, wherein the virtual set of the hardware resources provided to the test floor controller provides a virtual user interface between the test floor controller and a user of the test floor controller.

5. The semiconductor test control system of claim 4, wherein a particular virtual set of the hardware resources of the computer system provides a virtual user interface between a particular virtual appliance and a user of the particular virtual appliance.

6. The semiconductor test control system of claim 1, further comprising a virtual appliance installed on the computer system, the virtual appliance providing a test program for testing a semiconductor device.

7. The semiconductor test control system of claim 6, wherein the virtual appliance comprises a correlation engine, the correlation engine being configured to monitor an execution environment of the test program and, in response to the monitoring, adjust an execution parameter of the execution environment.

8. The semiconductor test control system of claim 7, wherein the execution parameter is a test program execution speed.

9. The semiconductor test control system of claim 1, wherein:
the test floor controller is configured to be placed in controlling communication with a plurality of virtual appliances; and
the test floor controller is configured to concurrently operate the plurality of virtual appliances, said concurrent operation causing the respective types of semiconductor devices to be tested in parallel.

10. The semiconductor test control system of claim 1, further comprising a plurality of virtual appliances installed on the computer system, wherein:
each of the virtual appliances provides a respective test program for testing a respective type of semiconductor device;
each virtual set of the hardware resources of the computer system places its respective virtual appliance in controlling communication with a respective set of resources of a shared tester of the semiconductor system; and
the test floor controller is configured to concurrently operate the plurality of virtual appliances, said concurrent operation causing the respective types of semiconductor devices to be tested in parallel by the shared tester.

11. The semiconductor test control system of claim 10, wherein:

a first of the virtual appliances provides a production test program;
a second of the virtual appliances provides a non-production test program; and
the test floor controller is configured to give operational priority to the first of the virtual appliances.

12. The semiconductor control system of claim 10, wherein said concurrent operation of the plurality of virtual appliances causes the respective semiconductor devices to be tested in parallel on a single wafer.

13. The semiconductor control system of claim 10, wherein said concurrent operation of the plurality of virtual appliances causes the respective semiconductor devices to be tested in parallel on a shared load board.

14. The semiconductor control system of claim 1, wherein the semiconductor test system comprises a multiple pin tester, and wherein the test floor controller provides a mapping of the virtual sets of hardware resources of the computer system to test pins of the multiple pin tester.

15. The semiconductor control system of claim 1, wherein the at least first aspect of the semiconductor test system comprises an aspect of an automated test equipment (ATE) system, and the at least second aspect of the semiconductor test system comprises an aspect of a prober/handler.

16. The semiconductor control system of claim 1, wherein the computer system comprises a server farm.

17. A semiconductor test environment, comprising:
a computer system having a plurality of hardware resources;
a prober/handler;
an automated test equipment (ATE) system;
a hypervisor installed on the computer system, the hypervisor virtualizing the hardware resources and providing each of at least two different virtual appliances with access to a different respective virtual set of the hardware resources, each of the different virtual set of the hardware resources placing a respective one of the different virtual appliances in controlling communication with an aspect of the ATE system that relate to execution of a test program for a particular type of semiconductor, thereby enabling the respective virtual appliance to test a respective type of semiconductor device; and
a test floor controller installed on the computer system, the test floor controller in controlling communication with i) the prober/handler, and ii) each of the different virtual appliance to operate each respective virtual appliance.

18. The semiconductor test system of claim 17, wherein a particular virtual set of the hardware resources of the computer system provides a virtual user interface between a particular virtual appliance and a user of the particular virtual appliance.

19. The semiconductor test system of claim 17, further comprising a plurality of virtual appliances installed on the computer system, wherein:
each of the virtual appliances provides a respective test program for testing a respective type of semiconductor device; and
the test floor controller concurrently operates the plurality of virtual appliances, said concurrent operation causing the respective semiconductor devices to be tested in parallel by the ATE system.

20. The semiconductor test system of claim 17, wherein the test floor controller provides a mapping of the virtual sets of hardware resources of the computer system to test pins of the ATE system.

* * * * *